(12) United States Patent
Song et al.

(10) Patent No.: US 10,803,802 B2
(45) Date of Patent: Oct. 13, 2020

(54) DISPLAY DEVICE

(71) Applicant: SAMSUNG DISPLAY CO., LTD., Yongin-si, Gyeonggi-do (KR)

(72) Inventors: Hee Rim Song, Yongin-si (KR); Mu Kyung Jeon, Yongin-si (KR); Mee Hye Jung, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/409,471

(22) Filed: May 10, 2019

(65) Prior Publication Data

US 2019/0385522 A1    Dec. 19, 2019

(30) Foreign Application Priority Data

Jun. 19, 2018  (KR) .......................... 10-2018-0070146

(51) Int. Cl.
  *G09G 3/32*      (2016.01)
  *G09G 3/3233*    (2016.01)
  *G09G 3/3266*    (2016.01)
  *G09G 3/3291*    (2016.01)
  *H01L 27/32*     (2006.01)

(52) U.S. Cl.
  CPC ......... *G09G 3/3233* (2013.01); *G09G 3/3266* (2013.01); *G09G 3/3291* (2013.01); *H01L 27/3276* (2013.01); *G09G 2300/043* (2013.01); *G09G 2300/0426* (2013.01); *G09G 2300/0809* (2013.01)

(58) Field of Classification Search
  CPC ..... G09G 2300/0426; G09G 2300/043; G09G 2300/0809; G09G 2300/081; G09G 2300/0842; G09G 2300/0861; G09G 2300/0866; G09G 2320/0233; G09G 3/3233; G09G 3/3266; G09G 3/3291; H01L 27/3276
  USPC ......................................................... 345/211
  See application file for complete search history.

(56) References Cited

U.S. PATENT DOCUMENTS

2006/0290828 A1* 12/2006 Hwang ............... H01L 27/3244
                                                      349/43
2008/0038884 A1*  2/2008 Hwang ............... H01L 27/1255
                                                      438/155
2010/0201673 A1*  8/2010 Kim ..................... G09G 3/3225
                                                      345/211

(Continued)

*Primary Examiner* — Tony O Davis
(74) *Attorney, Agent, or Firm* — Kile Park Reed & Houtteman PLLC

(57) ABSTRACT

A display device includes a plurality of pixels arranged in a first direction; a first data line extending along a first edge of the pixel row; a second data line extending along a second edge of the pixel row; a first pixel connected to the first data line; and a second pixel adjacent to the first pixel and connected to the second data line. Each of the first and second pixels includes a light emitting diode, a first transistor to transmit a driving current to the light emitting diode, a second transistor to transmit a data signal to the first transistor, a third transistor to transmit the data signal having a compensated threshold voltage to the first transistor, and a fourth transistor to transmit an initialization voltage signal to the first transistor. The first and second transistors are PMOS transistors. The third and fourth transistors are NMOS transistors.

20 Claims, 18 Drawing Sheets

(56) References Cited

U.S. PATENT DOCUMENTS

| | | | |
|---|---|---|---|
| 2013/0069070 A1* | 3/2013 | Ko | H01L 29/78621 |
| | | | 257/72 |
| 2014/0159038 A1* | 6/2014 | Im | H01L 29/7869 |
| | | | 257/43 |
| 2017/0069271 A1* | 3/2017 | Kim | H01L 27/124 |
| 2017/0200781 A1 | 7/2017 | Jin | |
| 2018/0366493 A1* | 12/2018 | Jeong | H01L 29/78621 |
| 2018/0366525 A1* | 12/2018 | Lee | H01L 29/66575 |
| 2019/0279567 A1* | 9/2019 | Hwang | G09G 3/3266 |

* cited by examiner

DISPLAY DEVICE

CROSS-REFERENCE TO RELATED APPLICATION

Korean Patent Application No. 10-2018-0070146, filed on Jun. 19, 2018, in the Korean Intellectual Property Office, and entitled: "Display Device," is incorporated by reference herein in its entirety.

BACKGROUND

1. Field

Embodiments relate to a display device.

2. Description of the Related Art

Flat panel display devices (FPDs) are used in various types of electronic products including mobile phones, tablet PCs, and notebook computers. Examples of the flat panel display device (hereinafter, simply referred to as a 'display device') may include a liquid crystal display device (LCD), a plasma display panel (PDP), and an organic light emitting display device (OLED), and, recently, an electrophoretic display device (EPD) has been widely used.

Among them, an organic light emitting display device displays an image by using an organic light emitting diode which generates light by recombination of electrons and holes. The organic light emitting display device includes a plurality of transistors that provide a driving current to the organic light emitting element.

SUMMARY

According to an aspect of the present disclosure, there is provided a display device. The display device includes a pixel row including a plurality of pixels arranged in a first direction; a first data line extending along the first direction at a first edge of the pixel row; a second data line extending along the first direction at a second edge of the pixel row along a second direction perpendicular to the first direction; a first pixel connected to the first data line; and a second pixel adjacent to the first pixel in the first direction and connected to the second data line. Each of the first pixel and the second pixel includes a light emitting diode, a first transistor to transmit a driving current to the light emitting diode, a second transistor to transmit a data signal to the first transistor, a third transistor to transmit the data signal having a compensated threshold voltage to a gate electrode of the first transistor, and a fourth transistor to transmit an initialization voltage signal to the gate electrode of the first transistor. The first transistor and the second transistor of the first pixel and the second pixel are PMOS transistors. The third transistor and the fourth transistor of the first pixel and the second pixel are NMOS transistors.

According to another aspect of the present disclosure, there is provided a display device. The display device includes a substrate on which a plurality of pixel regions is defined; a lower semiconductor layer on the substrate; a first conductive layer on the lower semiconductor layer; a second conductive layer on the first conductive layer; an upper semiconductor layer on the second conductive layer; a third conductive layer on the upper semiconductor layer; and a fourth conductive layer on the third conductive layer. The lower semiconductor layer is a semiconductor layer of an NMOS transistor and the upper semiconductor layer is a semiconductor layer of a PMOS transistor. The lower semiconductor layer, the first conductive layer, the second conductive layer, the upper semiconductor layer, the third conductive layer, and the fourth conductive layer are formed in the respective pixel regions.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
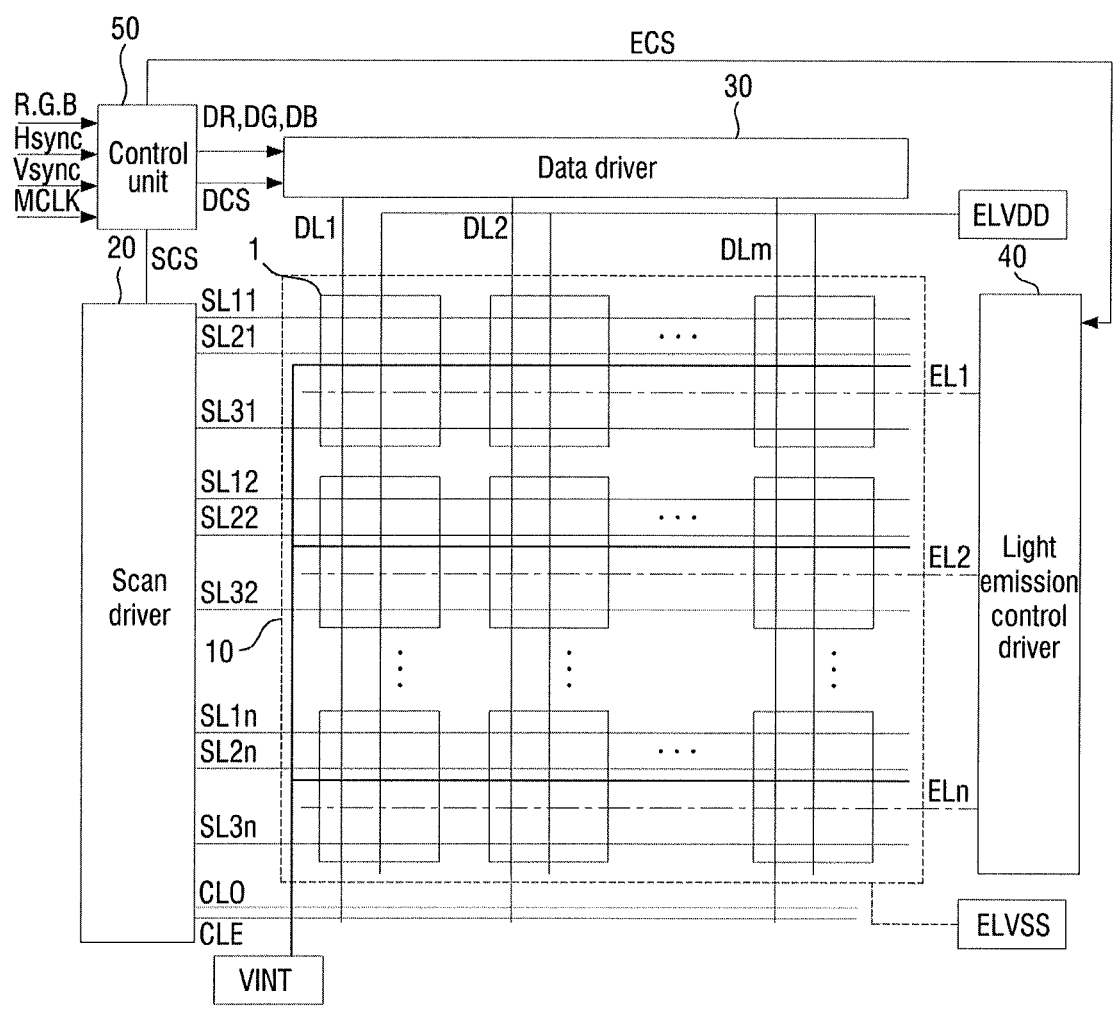
FIG. 1 illustrates a schematic block diagram of an organic light emitting display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the disclosure.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which the present application belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

In the drawings, components may be exaggerated or reduced in size for convenience of explanation. The same reference numerals are used for the same or similar components throughout the specification.

Hereinafter, embodiments will be described with reference to the accompanying drawings. Like reference numerals refer to like elements throughout the specification.

A display device according to various embodiments of a device for displaying a moving image or a still image, or a device for displaying a stereoscopic image, and may be used as a display screen for various products such as televisions, notebook computers, monitors, billboards, and things of internet as well as portable electronic appliances such as mobile communication terminals, smart phones, tablet PCs, smart watches, and navigators.

Hereinafter, embodiments will be described with reference to the attached drawings. Hereinafter, an organic light emitting display device will be described as an example of a display device. Additionally, embodiments may be applied to other display devices such as a liquid crystal display device, a field emission display (FED) panel, and an electrophoretic device, without changing the spirit of embodiments. The same or similar reference numerals are used for the same components in the drawings.

Figure 2:
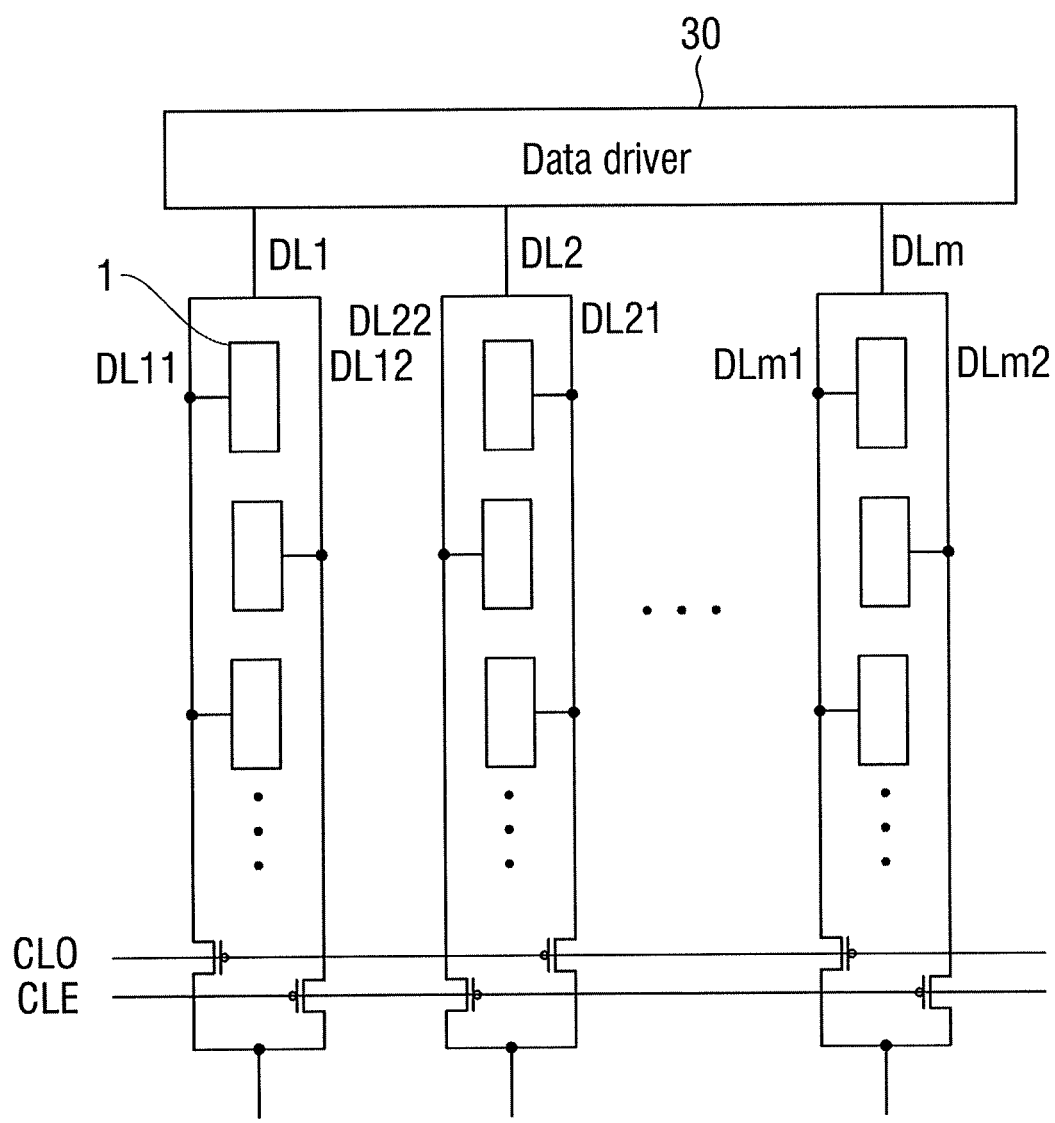
FIG. 2 illustrates a block diagram showing a relationship between pixels and data lines.

FIG. 1 is a schematic block diagram of an organic light emitting display device according to an embodiment. FIG. 2 is a block diagram showing a relationship between pixels and data lines. Referring to FIGS. 1 and 2, an organic light emitting display device 60 includes a display unit 10 including a plurality of pixels 1, a scan driver 20, a data driver 30, a light emission control driver 40, and a control unit 50.

The display unit 10 includes a plurality of pixels 1 arranged in a matrix form at intersection portions of a plurality of scan lines (SL11 to SL1n, SL21 to SL2n, and SL31 to SL3n), a plurality of data lines DL1 to DLm, and a plurality of light emission control lines EL1 to ELn.

The plurality of pixels 1 may be a plurality of color pixels. For example, the plurality of pixels 1 may include red, green, and blue pixels. The red, green, and blue pixels may be alternately arranged. The plurality of pixels 1 may further include a white pixel. In another embodiment, cyan, magenta, and yellow pixels may be arranged instead of the red, green, and blue pixels. Hereinafter, a case where the organic light emitting display device 60 includes red, green, and blue pixels will be described as an example.

The plurality of scan lines SL11 to SL1n, SL21 to SL2n, and SL31 to SL3n and the plurality of light emission control lines EL1 to ELn may extend in a row direction, e.g., a first direction, and the plurality of data lines DL1 to DLm may extend in a column direction, e.g., a second direction. The row direction and the column direction may be switched. Initialization voltage supply lines VINT may be branched for each row and extend in the row direction. First power source voltage supply lines ELVDD may be branched for each column and extend in the column direction. The extending directions of the initialization voltage supply line VINT and the first power source voltage supply line ELVDD may be variously modified.

Three scan lines SL11, SL21 and SL31, one data line DL1, one light emission control line EL1 one initialization voltage supply line VINT, and one first supply voltage line ELVDD may pass through a pixel of the first row and the first column, which is an exemplary pixel. Similarly, the above lines may pass through another pixel.

The scan driver 20 generates and transmits three scan signals to each pixel through the plurality of scan lines SL11 to SL1n, SL21 to SL2n, and SL31 to SL3n. That is, the scan driver 20 sequentially supplies scan signals to the first scan lines SL11 to SL1n, the second scan lines SL21 to SL2n, and the third scan lines SL31 to SL3n. The scan driver 20 alternately supplies data control signals through odd control signal lines CLO and even control signal lines CLE.

The data driver 30 transmits data signals to each pixel 1 through the plurality of data lines DL1 to DLm. The data signals are supplied to the pixel 1 selected by the first scan signal every time the first scan signals are supplied to the first scan lines SL11 to SL1n. Each of the data lines DL1 to DLm may include odd data lines DL11 to DLm1 for transmitting data signals to pixels arranged in odd rows and even data lines DL12 to DLm2 for transmitting data signals to pixels arranged in even rows. For example, the first data line DL1 may include a first odd data line DL11 and a first even data line DL12.

A pair of odd data lines DL11 to DLm1 and even data lines DL12 to DLm2 may pass through one pixel column. Each pixel 1 may be connected to any one of two data lines DL11 to DLm1 (DL12 to DLm2) passing through the corresponding column. For example, the pixels arranged in the odd rows may be directly connected to the odd data lines DL11 to DLm1, and the pixels arranged in the even rows may be directly connected to the even data lines DL12 to DLm2. For example, the first odd data line DL11 and the first even data line DL12 may pass through the pixel of the first row and the first column, but this pixel may be directly connected to the first odd data line DL11. In contrast, the first odd data line DL11 and the first even data line DL12 may pass through the pixel of the second row and the first column, but this pixel may be directly connected to the first even data line DL12.

The odd data lines DL11 to DLm1 include odd data switches, and the even data lines DL12 to DLm2 include even data switches. The odd data switches are connected to the odd control signal lines CLO and are turned on by odd control signals. The even data switches are connected to the even control signal lines CLE and are turned on by even control signals. In an embodiment, one horizontal synchronization time may be divided into the time when the odd data switches are turned on and the time when the even data switches are turned on. That is, the time when the odd data switches are turned on and the time when the even data switches are turned on may be independently divided without overlapping each other. The odd control signals and even control signals may be voltage signals based on scan driving control signals SCS.

In the organic light emitting display device 60, two data lines DL11 and DL12 are arranged in one pixel column to transmit data signals to the pixel, thereby reducing the leakage of bypass current ('Ibp' in FIG. 3) in high-frequency driving. Further, the organic light emitting display device 60 can reduce the probability that flicker is visually recognized by a user in the low-frequency driving, and can secure compensation time in the high-frequency driving. Here, the compensation time refers to a time for compensating a threshold voltage deviation. Details thereof will be described later.

The light emission control driver 40 generates and transmits light emission control signals ('EM' in FIG. 3) to each pixel 1 through the plurality of light emission control lines EL1 to ELn. The light emission control signals control the light emission time of the pixel 1. The light emission control driver 40 may be omitted depending on the internal structure of the pixel 1 or when the scan driver 20 generates light emission control signals as well as scan signals.

The control unit 50 converts a plurality of video signals. R, G and B transmitted from the outside into a plurality of video data signals DR, DG and DB and transmits them to the data driver 30. The control unit 50 receives a vertical synchronization signal Vsync, a horizontal synchronization signal Hsync, and a clock signal MCLK, and generates and transmits control signals for controlling the driving of the scan driver 20, the data driver 30, and the light emission control driver 40, for example, a scan driving control signal SCS for controlling the scan driver 20, a data driving control signal DCS for controlling the data driver 30, and a light emission driving control signal ECS for controlling the light emission control driver 40.

Each of the plurality of pixels 1 receives a first power supply voltage ELVDD and a second power supply voltage ELVSS. The first power source voltage ELVDD may be a predetermined high level voltage, and the second power source voltage ELVSS may be a voltage lower than the first power source voltage ELVDD.

Each of the plurality of pixels 1 emits light of a predetermined luminance by a driving current supplied to a light emitting element in response to data signals transmitted through the plurality of data lines DL1 to DLm.

The first power supply voltage ELVDD, the second power supply voltage ELVSS, the initialization voltage VINT, and the like may be supplied from an external voltage source.

Figure 3:
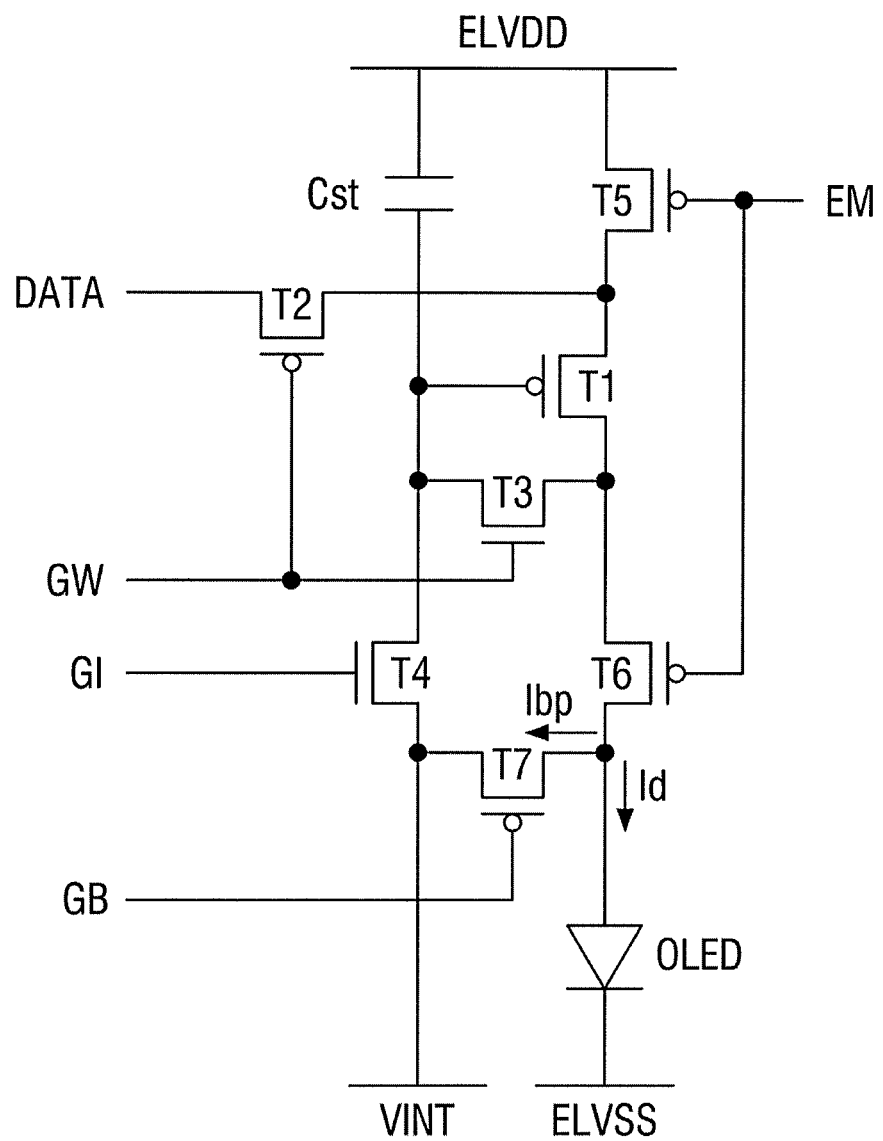
FIG. 3 illustrates an equivalent circuit diagram of one pixel of an organic light emitting display device according to an embodiment.

FIG. 3 is an equivalent circuit diagram of one pixel of an organic light emitting display device according to an embodiment. Referring to FIG. 3, the circuit of one pixel 1 of the organic light emitting display 60 includes an organic light emitting diode OLED, a plurality of transistors T1 to T7, and a storage capacitor Cst. A data signal DATA, a first scan signal GW, a scan line GD, a third scan signal GB, a light emission control signal EM, a first power supply voltage ELVDD, a second power supply voltage ELVSS, and an initialization voltage VINT are input to the circuit of one pixel 1.

More specifically, the organic light emitting diode OLED includes an anode electrode and a cathode electrode. The storage capacitor Cst includes a first electrode and a second electrode.

The plurality of transistors may include first to seventh transistors T1 to T7. Each of the transistors T1 to T7 includes a gate electrode, a first electrode, and a second electrode. One of the first electrode and second electrode of each of the transistors T1 to T7 is a source electrode, and the other thereof is a drain electrode.

Each of the transistors T1 to T7 may be a thin film transistor. Each of the transistors T1 to T7 may be any one of a PMOS and an NMOS transistor. In an embodiment, a first transistor T1 (a driving transistor), a second transistor T2 (a data transmitting transistor), a fifth transistor 15 (a first light emission control transistor), a sixth transistor T6 (a second light emission control transistor), and a seventh transistor T7 (a bypass transistor) are PMOS transistors. In contrast, a third transistor T3 (a compensating transistor) and a fourth transistor T4 (an initialization transistor) are NMOS transistors. The characteristics of the PMOS transistor and the NMOS transistor are different from each other. The third transistor T3 and the fourth transistor T4 are formed of NMOS transistors having relatively good turn-off characteristics so that the leakage of a driving current Id can be reduced during the light emission period of the organic light emitting diode OLED.

Next, a configuration of the pixel 1 will be described in detail.

The gate electrode of the first transistor T1 is connected to the first electrode of the storage capacitor Cst. The first electrode of the first transistor T1 is connected to a first power supply voltage ELVDD terminal via the fifth transistor T5. The second electrode of the first transistor T1 is connected to the anode electrode of the organic light emitting diode OLED via the sixth transistor T6. The first transistor T1 receives the data signal DATA according to the switching operation of the second transistor T2 and supplies the driving current Id to the organic light emitting diode OLED.

The gate electrode of the second transistor T2 is connected to a first scan signal GW terminal. The first electrode of the second transistor T2 is connected to a data signal DATA terminal. The second electrode of the second transistor T2 is connected to the first electrode of the first transistor T1, and is connected to the first power voltage ELVDD terminal through the fifth transistor T5. The second transistor T2 is turned on in response to the first scan signal GW to perform a switching operation of transmitting the data signal DATA to the first electrode of the first transistor T1.

The gate electrode of the third transistor T3 is connected to the first scan signal terminal. Specifically, the first scan signal line includes a first lower scan signal line ('210' in FIG. 4L) and a first upper scan signal line ('310' in FIG. 4L) to be described later. The gate electrode of the second transistor T2 is connected to the first lower scan signal line 210, and the gate electrode of the third transistor T3 is connected to the first upper scan signal line 310. The first lower scan signal line 210 is electrically connected to the first upper scan signal line 310 outside the display unit (10' in FIG. 1) to provide the first scan signal GW to the gate electrode of the second transistor T2 and the gate electrode of the transistor T3.

The first electrode of the third transistor T3 is connected to the second electrode of the first transistor T1, and is connected to the anode electrode of the organic light emitting diode OLED via the sixth transistor T6. The second electrode of the third transistor T3 is connected to the first electrode of the storage capacitor Cst, the first electrode of the fourth transistor T4, and the gate electrode of the first transistor T1. The third transistor T3 is turned on in response to the first scan signal GW to connect the gate electrode and second electrode of the first transistor T1 to each other to diode-connect the first transistor T1. Thus, a voltage difference is generated between the gate electrode and first electrode of the first transistor T1 by the threshold voltage of the first transistor T1, and a data signal DATA having a compensated threshold voltage is supplied to the gate electrode of the first transistor T1, thereby compensating for the threshold voltage deviation of the first transistor T1.

The gate electrode of the fourth transistor T4 is connected to a second scan signal terminal. The second electrode of the fourth transistor T4 is connected to an initialization voltage terminal. The first electrode of the fourth transistor T4 is connected together with the first electrode of the storage capacitor Cst, the second electrode of the third transistor T3, and the gate electrode of the first transistor T1. The fourth transistor T4 is turned on in response to the second scan signal GI to transmit the initialization voltage VINT to the gate electrode of the first transistor T1 to perform an operation of initializing the voltage of the gate electrode of the first transistor T1.

The gate electrode of the fifth transistor T5 is connected to a light emission control signal terminal. The first electrode of the fifth transistor T5 is connected to the first power supply voltage terminal. The second electrode of the fifth transistor T5 is connected to the first electrode of the first transistor T1 and the second electrode of the second transistor T2.

The gate electrode of the sixth transistor T6 is connected to the light emission control signal terminal. The first electrode of the sixth transistor T6 is connected to the second electrode of the first transistor T1 and the first electrode of the third transistor T3. The second electrode of the sixth transistor T6 is connected to the anode electrode of the organic light emitting diode OLED.

The fifth transistor T5 and the sixth transistor T6 are simultaneously turned on in response to the light emission control signal EM, so that the driving current Id flows through the organic light emitting diode OLED.

The gate electrode of the seventh transistor T7 is connected to a third scan signal terminal. The first electrode of the seventh transistor T7 is connected to the anode electrode of the organic light emitting diode OLED. The second electrode of the seventh transistor T7 is connected to the initialization voltage terminal. The seventh transistor T7 is turned on in response to the third scan signal GB to initialize the anode electrode of the organic light emitting diode OLED. When displaying a black image, the light emission current of the organic light emitting diode OLED, which is reduced by the amount of the bypass current Ibp that has passed through the seventh transistor T7 from the anode electrode of the organic light emitting diode OLED, may have a minimum amount of current to such a level that the black image is reliably expressed. Accordingly, it is possible to improve a contrast ratio by realizing an accurate black luminance image using the seventh transistor T7.

In this embodiment, the gate electrode of the seventh transistor T7 receives the third scan signal GB. Alternatively, the pixel circuit may be configured such that the gate electrode of the seventh transistor T7 receives the light emission control signal EM.

Further, in this embodiment, the second scan signal GI and the third scan signal GB are independent signals. Alternatively, the pixel circuit may be configured such that the second scan signal GI and the third scan signal GB are the same signals electrically connected to each other.

The second electrode of the storage capacitor Cst is connected to the first power supply voltage terminal. The first electrode of the storage capacitor Cst is connected to the gate electrode of the first transistor T1, the second electrode of the third transistor T3, and the first electrode of the fourth transistor T4. The cathode electrode of the organic light emitting diode OLED is connected to the second power supply voltage ELVSS terminal. The organic light emitting diode OLED receives the driving current Id from the first transistor T1 and emits light to display an image.

Each of the transistors T1 to T7 includes a conductive layer forming an electrode, a semiconductor layer forming a channel, and an insulating layer. The channels of the transistors T1 to T7 may not overlap each other, e.g., along a thickness direction or third direction, perpendicular to the first (row) and second (column) directions. In an embodiment, the first transistor T1, the second transistor T2, the fifth transistor T5, the sixth transistor T6, and the seventh transistor T7, which are PMOS transistors, may be thin film transistors using a polycrystalline silicon (p-Si) semiconductor layer. The third transistor T3 and the fourth transistor T4, which are NMOS transistors, may be thin film transistors using an oxide semiconductor layer.

Next, the plane arrangement and cross-sectional structure of the aforementioned pixel 1 will be described in detail. Hereinafter, one pixel ('PXi' in FIGS. 4A and 5) connected to the even data lines DL12 to DLm2 will be described as a reference.

Figure 4A:
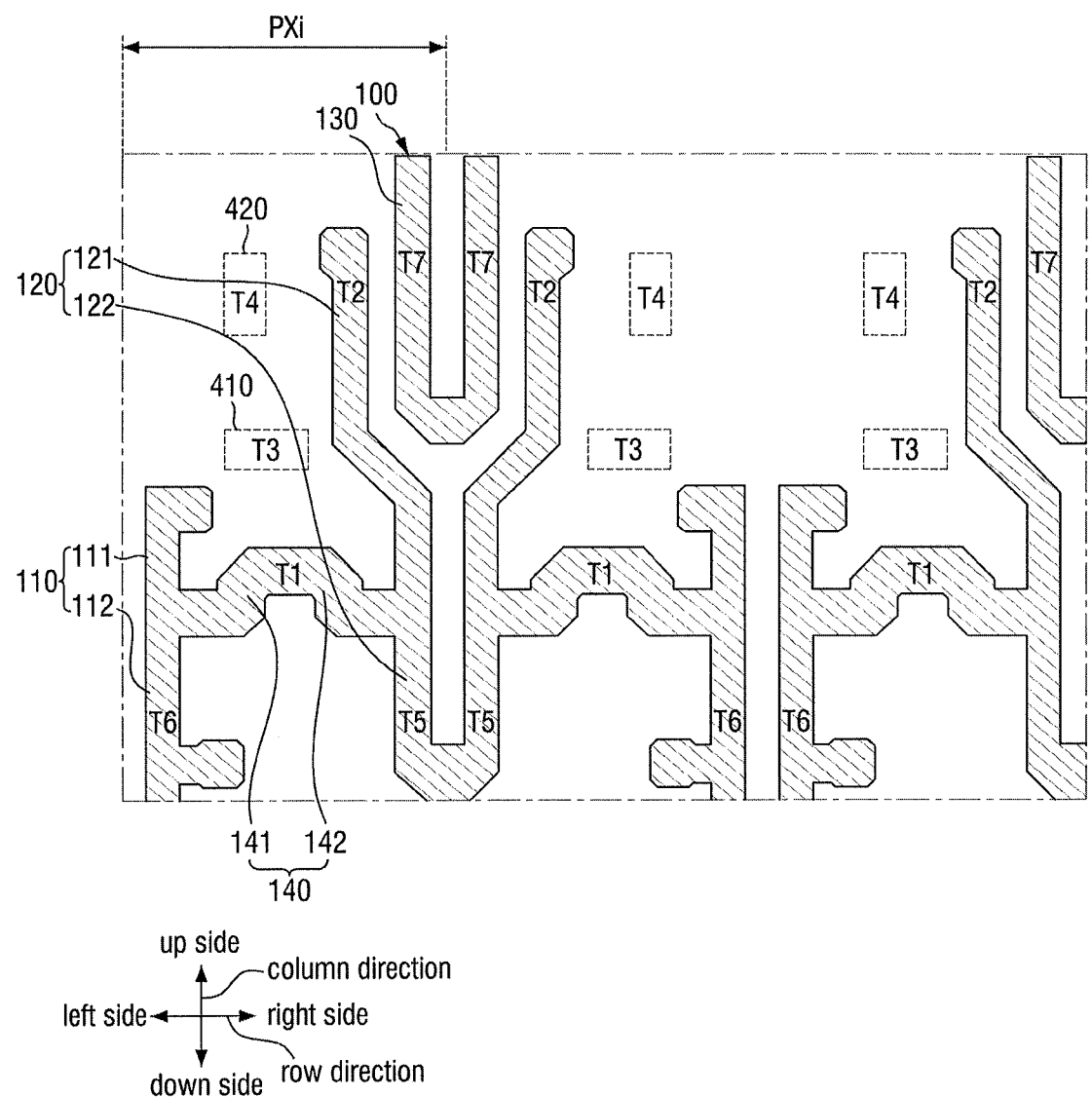
FIGS. 4A to 4L illustrate layout views of stages in a sequential laminating process of the organic light emitting display according to one embodiment.

FIGS. 4A to 4L are layout views of stages in a sequential laminating process of the organic light emitting display according to an embodiment. FIG. 5 is a cross-sectional view taken along the line I-I' in FIG. 4L. Referring to FIGS. 4A to 5, each pixel includes a plurality of transistors T1 to T7, a storage capacitor ('Cst' in FIG. 3), and an organic light emitting diode ('OLED' in FIG. 3).

Each of the transistors T1 to T7 includes a conductive layer forming an electrode, a semiconductor layer forming a channel, and an insulating layer. The first transistor T1, the second transistor T2, the fifth transistor T5, the sixth transistor T6, and the seventh transistor T7, which are PMOS transistors, may be top gate type transistors where the gate electrode is above the semiconductor layer. The third transistor T3 and the fourth transistor T4, which are NMOS transistors, may be bottom gate type transistors where the gate electrode is below the semiconductor layer.

The storage capacitor Cst includes conductive layers constituting electrodes and an insulating layer between the conductive layers. The organic light emitting diode OLED includes conductive layers constituting an anode electrode and a cathode electrode, and an organic light emitting layer therebetween. The electrical connection of the respective elements may be made by a wirings made of a conductive layer and/or a via made of a conductive material. The above-described conductive material, conductive layer, semiconductor layer, insulating layer, organic light emitting layer, and the like are disposed on a substrate 810 (FIG. 5).

As may be seen in FIG. 5, respective layers of one pixel PXi may be arranged in order, e.g., along the stacking or thickness or third direction, of the substrate 810, a buffer layer 820, a lower semiconductor layer 100 (FIG. 4A), a first insulating layer 831, first conductive layers 210, 220, and 240 (FIG. 4B), a second insulating layer 832, second conductive layers 310, 320, 330, and 340 (FIG. 4C), a third insulating layer 833, upper semiconductor layers 410 and 420 (FIG. 4D), third conductive layers 510, 520, and 530 (FIG. 4F), a fourth insulating layer 834, fourth conductive layers 610 and 620, 630 (FIG. 4H), and 640, a fifth insulating layer 841, fifth conductive layer 710, 720, and 730 (FIG. 4J), a sixth insulating layer 842, and an anode electrode AND. Each of the above-described layers may be formed of a single film, but may also be formed of a laminate film including a plurality of films. Additional layers may be between the respective layers and/or some of the above layers above may be omitted.

The substrate 810 supports the respective layers thereon. When the organic light emitting display device 60 is a back-sided or double sided light emission type, a transparent substrate may be used as the substrate 810. When the organic light emitting display device 60 is a front-sided light emission type, a translucent or opaque substrate as well as a transparent substrate may be used as the substrate 810.

The substrate 810 may be formed of an insulating material, e.g., glass, quartz, or a polymer resin. Examples of the polymer resin may include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), combinations thereof, or the like.

The substrate 810 may be a rigid substrate or a flexible substrate, e.g., capable of being bent, folded, rolled, or the like. An example of the material constituting the flexible substrate 810 may be polyimide (PI).

The buffer layer 820 may be on the entire surface of the substrate 810. The buffer layer 820 may prevent the diffusion of impurity ions, may prevent the penetration of moisture or external air, and may serve to planarize the substrate 810. The buffer layer 820 may include silicon nitride, silicon oxide, silicon oxynitride, or the like. The buffer layer 820 may be omitted depending on the type of the substrate 810, process conditions, and the like.

The lower semiconductor layer 100 is an active layer that forms a channel of the first transistor T1, the second transistor T2, the fifth transistor 15, the sixth transistor T6, and the seventh transistor T7. The lower semiconductor layer 100 may have a specific pattern in a plan view.

For example, as illustrated in FIG. 4A, the lower semiconductor layer 100 may include a first vertical portion 110, a second vertical portion 120 and a third vertical portion 130, which extend in the substantially column direction, and a horizontal portion 140 which extends in the substantially row direction. In an embodiment, the first vertical portion 110, the second vertical portion 120, and the horizontal portion 140 may be physically connected to each other, and the third vertical portion 130 may be physically separated from the first vertical portion 110, the second vertical portion 120, and the horizontal portion 140. Alternatively, the first vertical portion 110, the second vertical portion 120, the third vertical portion 130, and the horizontal portion 140 may all be physically connected to each other.

The first vertical portion 110 may be adjacent to the left side of the pixel PXi. The second vertical portion 120 and the third vertical portion 130 may be adjacent to the right side of the pixel PXi. The first vertical portion 110 and the second vertical portion 120 may be spaced apart from each other, e.g., along the row direction. The first vertical portion 110 and second vertical portion 120 may be adjacent to the down side of the pixel PXi. The second vertical portion 120 have a longer length in the column direction than the first vertical portion 110, e.g., may extend closer to the up side of the pixel PXi.

The horizontal portion 140 may connect an intermediate portion between the first vertical portion 110 and the second vertical portion 120 along the row direction. In the present specification, the "upper portions 111 and 121" of the first vertical portion 110 and the second vertical portion 120 may refer to portions located above a connection portion with the horizontal portion 140 in a plan view, and the "lower portions 112 and 122" thereof may refer to portions located below the connection portion with the horizontal portion 140 on the plane.

The third vertical portion 130 may be adjacent to the right side of the upper portion of the second vertical portion 120. The third vertical portion 130 may be to be spaced apart from the second vertical portion 120. The third vertical portion 130 may extend further upward than the upper portion 121 of the second vertical portion 120, e.g., may be adjacent to the up side of the pixel PXi. The third vertical portion 130 may partially overlap the upper portion 121 and lower portion 122 of the second vertical portion 120 along the column direction, e.g., the upper portion 121 may include a bend therein along the row direction away from the right side, while then further extending along the column direction, such that the upper portion 121 and the third vertical portion 130 partially overlap along the row direction.

The channel of the sixth transistor T6 may be in the lower portion 112 of the first vertical portion 110. The channel of the second transistor T2 may be in the upper portion 121 of the second vertical portion 120. The channel of the fifth transistor T5 may be in the lower portion 122 of the second vertical portion 120. The channel of the seventh transistor T7 may be in the third vertical portion 130. The channel of the first transistor T1 may be in the horizontal portion 140.

Although the horizontal portion 140 may connect the first vertical portion 110 and the second vertical portion 120 by the shortest distance, e.g., a straight line, as shown in the drawings, the horizontal portion 140 may include a first bent portion 141 at left and a second bent portion 142 at right. The total length of the horizontal portion 140 may increase through multiple bending.

The lower semiconductor layer 100 may be isolated for each pixel. If a boundary defined by the column direction as a boundary between one pixel PXi and another pixel adjacent in the row direction is defined as a reference line, the shape of the lower semiconductor layer of one pixel PXi may be linearly symmetrical, e.g. mirror symmetry, to the shape of the lower semiconductor layer of another pixel adjacent to the one pixel PXi in the row direction with respect to the reference line. Thus, the third vertical portion 130 in one pixel PXi may be physically connected to the third vertical portion of another pixel adjacent in the row direction. Similarly, the lower portion 122 of the second vertical portion 120 in one pixel PXi may be physically connected to that of another pixel. Further, the third vertical portion 130 of the semiconductor layer of one pixel PXi may be physically connected to the lower portion 122 of the second vertical portion 120 of another pixel adjacent to the pixel PXi in the column direction, e.g., the same pattern is repeated.

The lower semiconductor layer 100 may include polycrystalline silicon. The polycrystalline silicon may be formed by crystallizing amorphous silicon. Examples of the crystallization method may include rapid thermal annealing (RTA), solid phase crystallization (SPC), excimer laser annealing (ELA), metal induced crystallization (MIC), metal induced lateral crystallization (MILC), and sequential lateral solidification (SLS). In an embodiment, the lower semiconductor layer 100 may include single crystal silicon, low-temperature polycrystalline silicon, amorphous silicon, or the like.

In the lower semiconductor layer 100, the regions (source/drain regions) connected to the source/drain electrodes of each of the transistors T1, T2, T5, T6, T7 may be doped with impurity ions (p-type impurity ions in the case of a PMOS transistor). A trivalent dopant, e.g., boron (B), may be used as p-type impurity ions.

As shown in FIG. 5, the first insulating layer 831 may be on the lower semiconductor layer 100, and may extend over the entire surface of the substrate 810. The first insulating layer 831 may be a gate insulating film having a gate insulating function.

The first insulating layer 831 may include a silicon compound or a metal oxide. For example, the first insulating layer 831 may include silicon oxide, silicon nitride, silicon oxynitride, aluminum oxide, tantalum oxide, hafnium oxide, zirconium oxide, or titanium oxide. These compounds may be used alone or as a combination of two or more. The first insulating layer 831 may be a single film or a multilayer film formed of a laminate film of different materials.

Figure 4B:
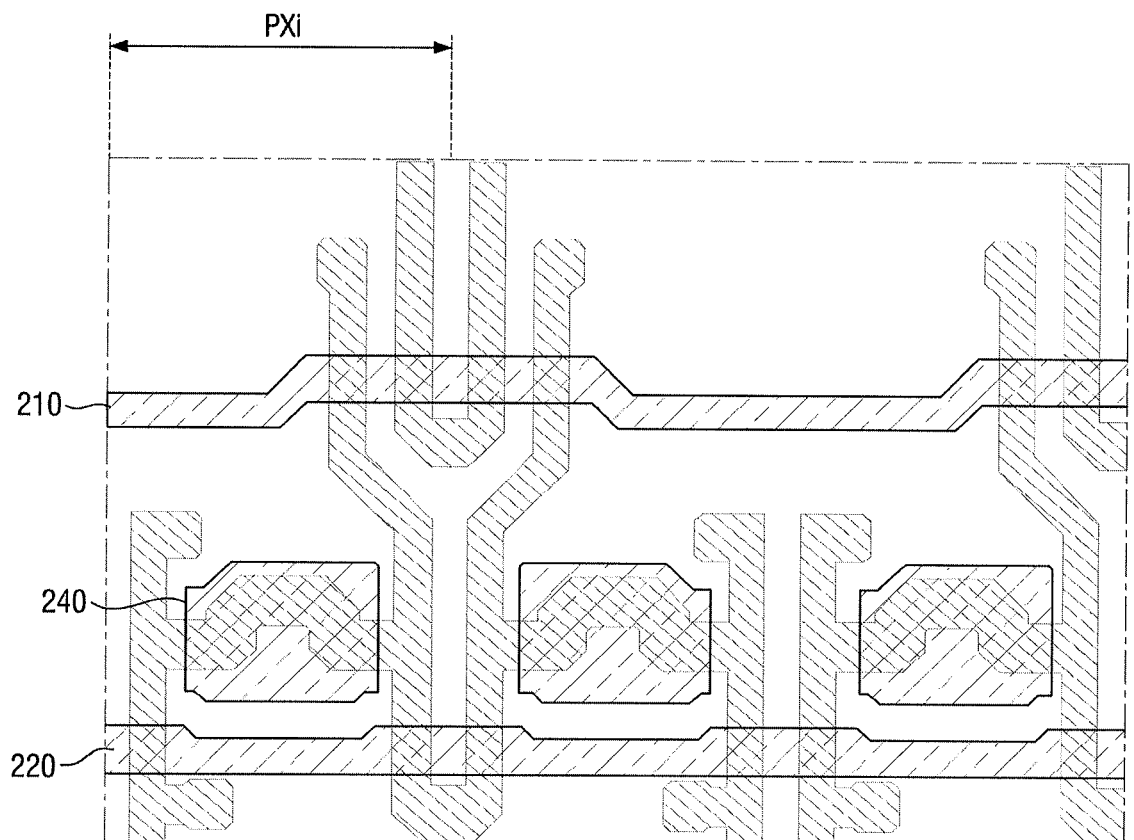
Figure 4B:
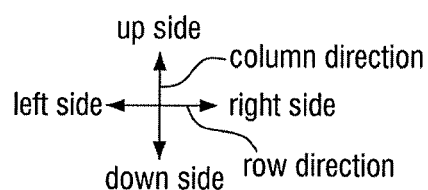
Figure 5:
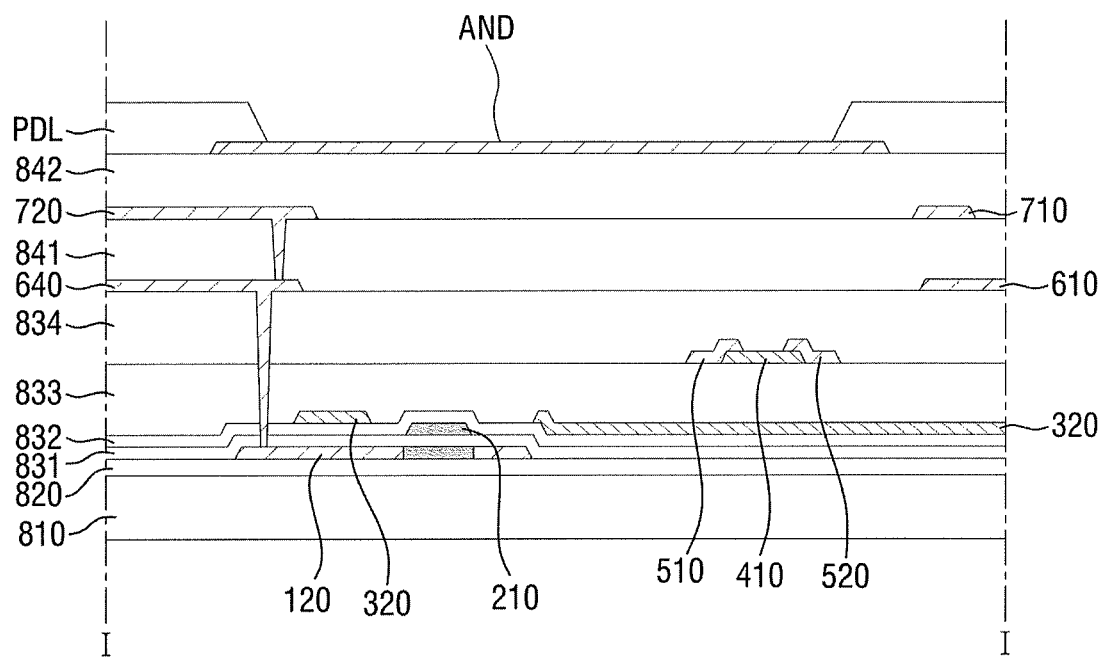
FIG. 5 illustrates a cross-sectional view taken along the line in FIG. 4L.

As shown in FIGS. 4B and 5, the first conductive layers 210, 220, and 240 are on the first insulating layer 831. The first conductive layers 210, 220, and 240 may include a first lower scan signal line 210 transmitting a first scan signal ('GW' in FIG. 3, the same below), a gate electrode 240 of the first transistor T, and a first light emission control line 220 transmitting a light emission control signal ('EM' in FIG. 3).

The first lower scan signal line 210 may include a gate electrode of the second transistor T2 and a gate electrode of the seventh transistor T. The first light emission control line 220 may include a gate electrode of the fifth transistor T5 and a gate electrode of the sixth transistor T6.

The first lower scan signal line 210 and the first light emission control line 220 may extend along the row direction. As shown in the drawings, the first lower scan signal line 210 and the first light emission control line 220 may extend to the neighboring pixel beyond the boundary of the pixel PXi along the row direction.

The first lower scan signal line 210 may be located above the middle of the pixel PXi in a plan view. The first lower scan signal line 210 may overlap the upper portion 121 of the second vertical portion 120 and the third vertical portion 130, such that the gate electrode of the second transistor T2 and the gate electrode of the seventh transistor T7 may be formed at the corresponding overlapping portion. Unless otherwise defined, the expression "overlap" in this specification means that two components overlap each other in the thickness direction of the organic light emitting display device 60 (in the drawing, a direction perpendicular to the surface of the substrate 810, e.g., a stacking direction or a third direction).

The upper portion 121 of the second vertical portion 120 of the lower semiconductor layer 100 located below the overlapping region, e.g., extending toward the down side of the pixel PXi, may become a first electrode region of the second transistor T2, and the upper portion 121 of the second vertical portion 120 of the lower semiconductor layer 100 located above the overlapping region, e.g., extending towards the upside of the pixel PXi may become a second electrode region of the second transistor T2. The third vertical portion 130 of the lower semiconductor layer 100 located below the overlapping region e.g., extending toward the down side of the pixel PXi, may become a first electrode region of the seventh transistor T7, and the third vertical portion 130 of the lower semiconductor layer 100 located above the overlapping region, e.g., extending toward the up side of the pixel PXi, may become a second electrode region of the seventh transistor T7. The first lower scan signal line 210 may not overlap the lower portion 122 of the second vertical portion or the first vertical portion 110.

The first light emission control line 220 may be located below the first lower scan signal line 210 in a plan view, e.g., closer to the down side of the pixel PXi. The first light emission control line 220 may overlap the lower portion 112 of the first vertical portion 110 and the lower portion 122 of the second vertical portion 120 in the lower semiconductor layer 100.

The first light emission control line 220 may form a gate electrode of the sixth transistor T6 at a portion overlapping the lower portion 112 of the first vertical portion 110 of the lower semiconductor layer 100. The first vertical portion 110 of the lower semiconductor layer 100 located above the overlapping region, e.g., extending toward the up side of the pixel PXi, may become a first electrode region of the sixth transistor T6, and the first vertical portion 110 of the lower semiconductor layer 100 located below the overlapping region, e.g., extending toward the down side of the pixel PXi, may become a second electrode region of the sixth transistor T6.

Further, the first light emission control line 220 may form a gate electrode of the fifth transistor T5 at a portion overlapping the lower portion 122 of the second vertical portion 120 of the lower semiconductor layer 100. The lower portion 122 of second vertical portion 120 of the lower semiconductor layer 100 located above the overlapping region, e.g., extending toward the up side of the pixel PXi, may become a first electrode region of the fifth transistor T5, and the lower portion 122 of the second vertical portion 120 of the lower semiconductor layer 100 located below the overlapping region, e.g., extending toward the down side of the pixel PXi, may become a second electrode region of the fifth transistor T5.

The gate electrode of the second transistor T2, the gate electrode of the fifth transistor T5, the gate electrode of the sixth transistor T6, and the gate electrode of the seventh transistor T7 have wider widths along the column direction than corresponding peripheral lines.

The gate electrode 240 of the first transistor T1 may be located at the center of the pixel PXi. The gate electrode 240 of the first transistor T1 may be located between the first lower scan signal GW line 210 and the first light emission control line 220 in a plan view. The gate electrode 240 of the first transistor T1 may be isolated for each pixel PXi.

Figure 4C:
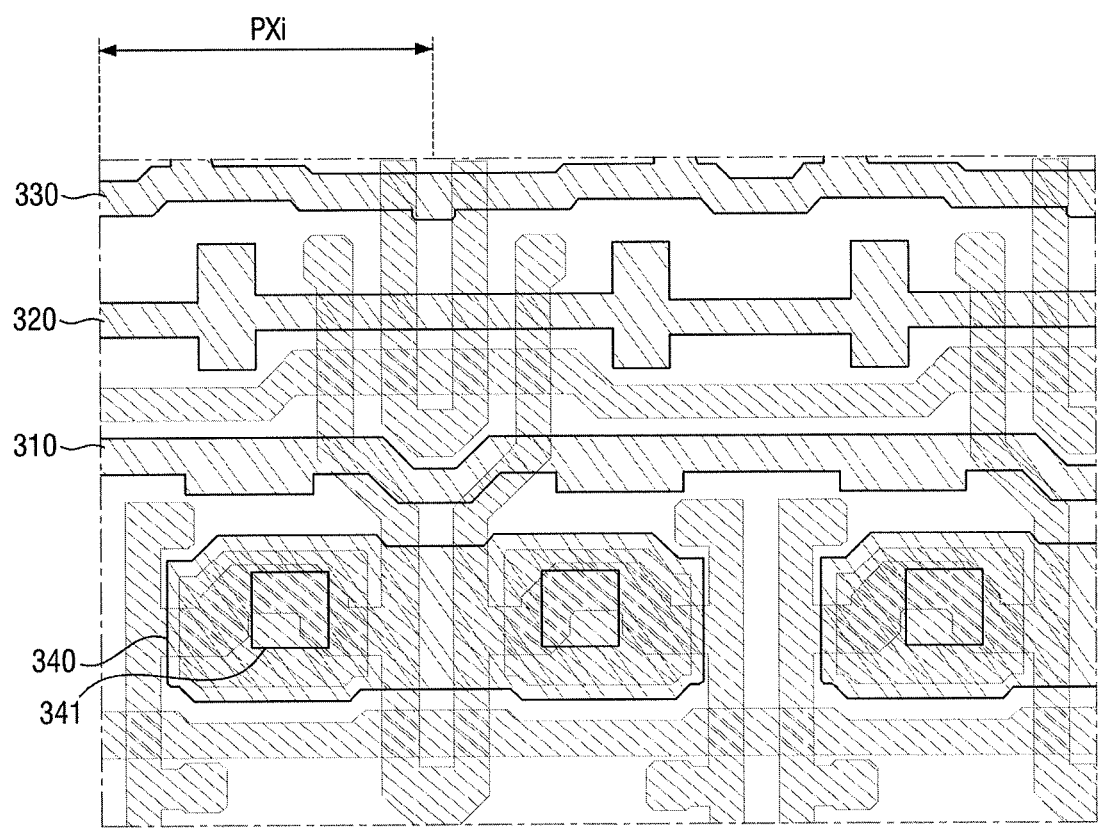
Figure 4C:
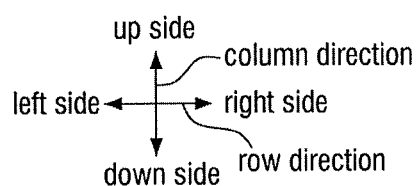

The gate electrode 240 of the first transistor T1 may form a storage capacitor electrode 340 shown in FIG. 4C and a storage capacitor ('Cst' in FIG. 3).

The gate electrode 240 of the first transistor T1 overlaps the horizontal portion 140 of the lower semiconductor layer 100 along the third direction. The horizontal portion 140 of the lower semiconductor layer 100 located at the left side of the overlapping region may become a first electrode region of the first transistor T1, and the horizontal portion 140 of the lower semiconductor layer 100 located at the right side of the overlapping region may become a second electrode region of the first transistor T1.

The first conductive layers 210, 220, and 240 may include at least one of molybdenum (Mo), aluminum (Al), platinum (Pt), palladium (Pd), silver (Ag), magnesium (Mg), gold (Au), nickel (Ni), neodymium (Nd), iridium (Ir) (Cr), calcium (Ca), titanium (Ti), tantalum (Ta), tungsten (W), or the like. Each of the first conductive layers 210, 220, and 240 may be a single film or a multilayer film. In an embodiment, each of the first conductive layers 210, 220, 240 may include a gate conductive material, e.g., molybdenum (Mo).

As shown in FIG. 5, the second insulating layer 832 may be on the first conductive layers 210, 220, and 240, and may be formed over the entire surface of the substrate 810. The first insulating layer 831 may be a gate insulating film having a gate insulating function. The second insulating layer 832 may include the same material as the first insulating layer 831, or may include at least one selected from the exemplified materials constituting the first insulating layer 831. The second insulating layer 832 may be a single film or a multilayer film formed of a laminate film of different materials.

The second conductive layers 310, 320, 330, 340 (see FIG. 4C) may be on the second insulating layer 832. The second conductive layers 310, 320, 330, 340 may include a first upper scan signal line 310 transmitting a first scan signal ('GW_n' in FIG. 3), a second scan signal line 320 transmitting a second scan signal ('GI' in FIG. 3), a storage capacitor electrode 340, and an initialization voltage line 330 supplying an initialization voltage ('VINT' in FIG. 3).

As illustrated in FIG. 4C, the first upper scan signal line 310, the second scan signal line 320, and the initialization voltage line 330 may extend along the row direction. The first upper scan signal line 310, the second scan signal line 320, and the initialization voltage line 330 may extend to the neighboring pixel beyond the boundary of the pixel PXi along the row direction.

The first upper scan signal line 310 may be located below the first upper scan signal line 210 in a plan view. The first upper scan signal line 310 is isolated from the first lower scan signal line 210. The second scan signal line 320 may be located above the first upper scan signal line 310 in a plan view. The initialization voltage line 330 may be located above the second scan signal line 320 in a plan view, e.g., adjacent to the up side of the pixel PXi.

The first upper scan signal line 310 may include a gate electrode of the third transistor T3, and the second scan signal line 320 may include a gate electrode of the fourth transistor T4. The gate electrode of the third transistor T3 and the gate electrode of the fourth transistor T4 may have wider widths along the column than corresponding peripheral lines.

The storage capacitor electrode 340 is between the first upper scan signal line 310 and the light emission control line 220 in a plan view, and overlaps the gate electrode 240 of the first transistor T1 along the third direction. As described above, the storage capacitor electrode 340 overlap the underlying gate electrode 240 of the first transistor T1 with the second insulating layer 832 therebetween to form a storage capacitor Cst. The gate electrode 240 of the first transistor T1 becomes the first electrode of the storage capacitor Cst, the extended region of the storage capacitor electrode 340 overlapped therewith becomes the second electrode of the storage capacitor Cst, and the second insulating layer 832 interposed therebetween may be a dielectric of the storage capacitor Cst. As shown in the drawing, the storage capacitor Cst may include at least one opening 341 at a portion overlapping the gate electrode 240 of the first transistor T1.

In the drawing, the storage capacitor electrode 340 is shown to be physically spaced apart from another neighboring storage capacitor electrode. Alternatively, the storage capacitor electrode 340 may have a shape extending in the row direction, e.g., continuously.

The width of the storage capacitor electrode 340 may extend in a region overlapping the gate electrode 240 of the first transistor T1, e.g., may be larger than the gate electrode 240. The storage capacitor electrode 340 may include an opening overlapping the gate electrode 240 of the underlying first transistor T1 in the extended region.

The second conductive layers 310, 320, 330, and 340 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir) (Cr), calcium (Ca), titanium (Ti), tantalum (Ta), and tungsten (W). Each of the first conductive layers 210, 220, and 240 may be a single film or a multilayer film. In an embodiment, each of the second conductive layers 310, 320, 330, and 340, similarly to each of the first conductive layers 210, 220, 240, may include a gate conductive material, e.g., molybdenum (Mo).

As illustrated in FIG. 5, the third insulating layer 833 covers the second conductive layers 310, 320, 330, and 340. The third insulating layers 833 serves to insulate the second conductive layers 310, 320, 330, and 340 from the upper semiconductor layers 410 and 420. The third insulating layer 833 may be on the second conductive layers 310, 320, 330, and 340, and may be over the entire surface of the substrate 810. The third insulating layer 833 may be an interlayer insulating film. The third insulating layer 833 may include an inorganic insulating material, e.g., silicon oxide, silicon nitride, silicon oxynitride, hafnium oxide, aluminum oxide, titanium oxide, tantalum oxide, or zinc oxide, or an organic insulating material such as polyacrylate resin, epoxy resin, phenolic resin, polyamide resin, polyimide resin, unsaturated polyester resin, polyphenylene ether resin, polyphenylene sulfide resin, or benzocyclobutene (BCB) resin. The third insulating layer 833 may be a single film or a multilayer film formed of a laminate film of different materials.

Figure 4D:
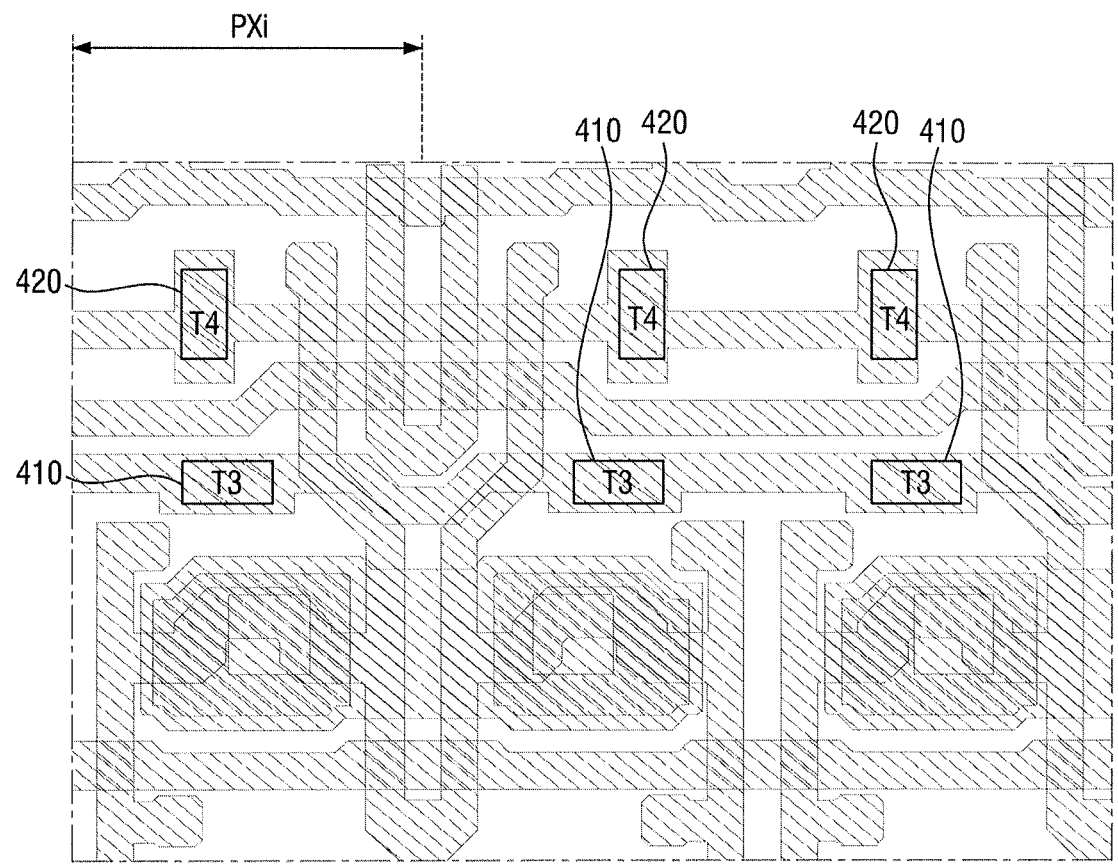

The upper semiconductor layers 410 and 420 are on the third insulating layer 833. The upper semiconductor layers 410 and 420 may include a plurality of semiconductor patterns separated from each other in one pixel PXi. As illustrated in FIG. 4D, upper semiconductor layers 410 and 420 may include a first upper semiconductor pattern 410 that overlaps the gate electrode of the third transistor T3 to form the channel of the third transistor T3 and a second upper semiconductor pattern 420 that overlaps the gate electrode of the fourth transistor T4 to form the channel of the fourth transistor T4. Each of the first upper semiconductor pattern 410 and the second upper semiconductor pattern 420 may have a rectangular shape. Further, each of the first upper semiconductor pattern 410 and the second upper semiconductor pattern 420 may be smaller in width, e.g., along the row direction, than the gate electrodes they respectively overlap.

The upper semiconductor layers 410 and 420 may include an oxide semiconductor. For example, the upper semiconductor layers 410 and 420 may include any one of amorphous silicon (a-Si), polycrystalline silicon (p-Si), and an oxide semiconductor or an organic semiconductor. Here, the oxide semiconductor may include at least one of Zn, In, Ga, Sn, mixtures thereof, and the like. The oxide semiconductor, as a metal oxide semiconductor, may include an oxide of a metal such as zinc (Zn), indium (In), gallium (Ga), tin (Sn), or titanium (Ti) or a combination of a metal such as zinc (Zn), indium (In), gallium (Ga), tin (Sn), or titanium (Ti) and an oxide thereof, or the like. For example, the oxide semiconductor may include at least one of zinc oxide (ZnO), zinc-tin oxide (ZTO), zinc-indium oxide (ZIO), indium oxide (InO), titanium oxide (TiO), indium-gallium-zinc oxide (IGZO), indium-zinc-tin oxide (IZTO), or the like.

The upper semiconductor layers 410 and 420 may include a source region at a first side thereof, a drain region at a second side thereof, and a channel region between the source region and the drain region. In the upper semiconductor layers 410 and 420, the regions (source region and drain region) connected to the first and second electrodes of each of the transistors T3 and T4 may be doped with impurity ions (n-type impurity ions in the case of a NMOS transistor). The n-type impurity ions may be an alkali metal or an alkaline earth metal, or may be an n-type organic dopant. Examples of the n-type organic dopant may include Cr2hpp4 (hpp: anions of 1,3,4,6,7,8-hexahydro-2H-pyrimido[1,2-a]pyrimidine), Fe2hpp4, Mn2hpp4, Co2hpp4, Mo2hpp4, W2hpp4, Ni2hpp4, Cu2hpp4, Zn2hpp4, and W(hpp)4. In addition, examples of the n-type organic dopant may include organic dopant compounds such as 4,4',5,5'-tetracyclohexyl-1,1',2,2',3,3'-hexamethyl-2,2',3,3-tetrahydro-1H, 1'H-2,2'-biimidazole; 2,2'-diisopropyl-1,1',3,3'-tetramethyl-2,2',3,3',4,4',5,5',6,6',7,7'-dodecahydro-1H,1'H-2,2'-bibenzo[d]imidazole; 2,2'-diisopropyl-4,4',5,5'-tetrakis(4-methoxyphenyl)-1,1',3,3'-tetramethyl-2,2',3,3'-tetrahydro-1H, 1'H-2,2'-biimidazole; 2,2'-diisopropyl-4,5-bis(2-methoxyphenyl)-4',5'-bis(4-methoxyphenyl)-1,1',3,3'-tetramethyl-2,2',3,3'-tetrahydro-1H,1'H-2,2'-biimidazole); and 2,2'-diisopropyl-4,5-bis(2-methoxyphenyl)-4',5'-bis(3-methoxyphenyl)-1,1',3,3'-tetramethyl-2,2',3,3'-tetrahydro-1H, 1'H-2,2'-biimidazole.

When the upper semiconductor layers 410 and 420 include an oxide semiconductor, a light blocking layer for blocking light entering the upper semiconductor layers 410 and 420 may be included above and below the upper semiconductor layers 410 and 420 along the third direction.

Figure 4E:
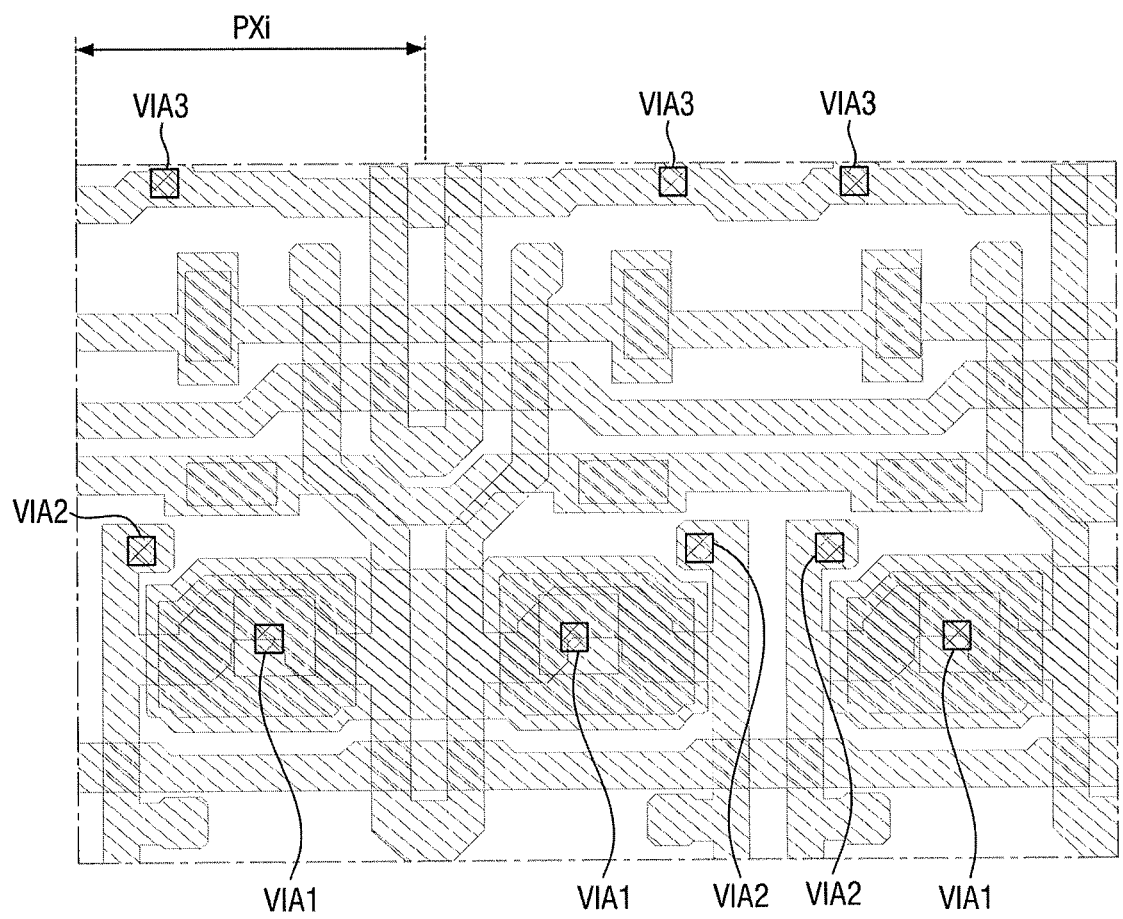
Figure 4E:
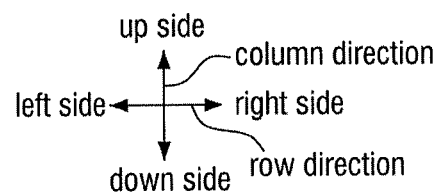

As shown in FIG. 4E, first to third contact holes VIA1 to VIA3 may be formed.

A first contact hole VIA1 exposing a part of the gate electrode 240 of the first transistor T1, a part of the initialization voltage line 330, and a part of the horizontal portion 140 of the lower semiconductor layer 100 may be formed in the gate electrode 240 of the first transistor T1, the initialization voltage line 330, and the horizontal portion 140 of the lower semiconductor layer 100. Through the first contact hole VIA1, a first data pattern 510 of third conductive layers 510, 520, and 530 to be described later may be brought into contact with the gate electrode 240 of the first transistor T1, the initialization voltage line 330, and the upper portion of the horizontal portion 140 of the lower semiconductor layer 100.

A second contact hole VIA2 exposing a part of an upper portion 111 of the first vertical portion 110 may be formed in the upper portion of the first vertical portion of the lower semiconductor layer 100. Through the second contact hole VIA2, a second data pattern 520 of third conductive layers 510, 520, and 530 to be described later may be brought into contact with the upper portion 111 of the first vertical portion 110 of the lower semiconductor layer 100.

A third contact hole VIA3 exposing a part of the initialization voltage line 330 may be formed in the initialization voltage line 330. Through the third contact hole VIA3, a third data pattern 530 of third conductive layers 510, 520, and 530 to be described later may be brought into contact with the initialization voltage line 330.

Figure 4F:
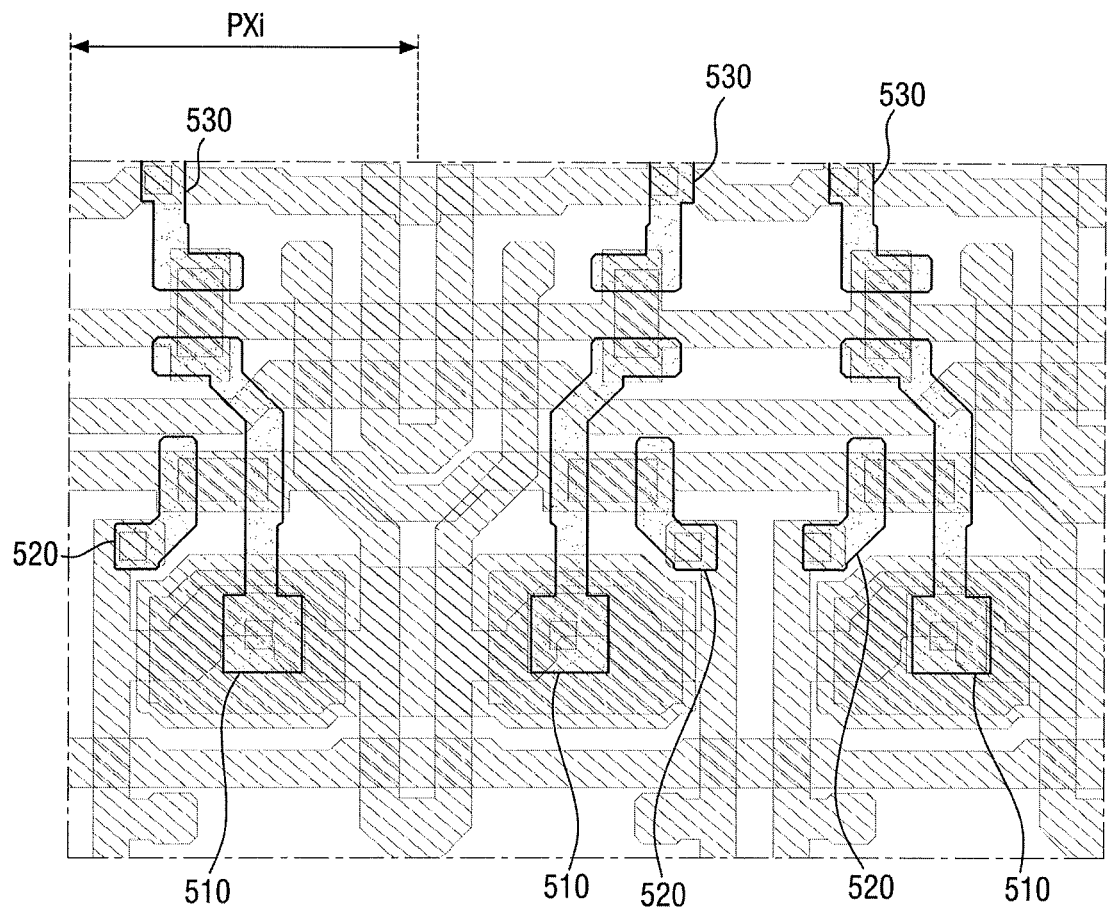
Figure 4F:
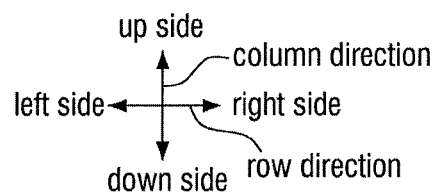

As shown in FIG. 4F, the third conductive layer 510, 520, and 530 may be on the upper semiconductor layers 410 and 420. In an embodiment, the third conductive layer 510, 520, and 530 may be directly on the upper semiconductor layers 410 and 420. The third conductive layers 510, 520, and 530 may include a plurality of data patterns 510, 520, and 530 transmitting data signals ('DATA' in FIG. 3). The plurality of data patterns 510, 520, and 530 may be source/drain electrodes contacting the source/drain regions of the upper semiconductor layers 410 and 420.

Each of the data patterns 510, 520, and 530 has a shape extending substantially in the column direction, and the length of each of the data patterns 510, 520, and 530 in the column direction is smaller than the length of the pixel PXi in the column direction. The respective data patterns 510, 520, and 530 are physically spaced apart from one another. Each of the data patterns 510, 520, and 530 may electrically connect the portions away from each other, and may constitute the first electrode or second electrode of an NMOS transistor. Each of the data patterns 510, 520, and 530 may be in direct contact with the upper surfaces of the upper semiconductor layers 410 and 420, or may be in contact with the upper surfaces thereof through an ohmic contact layer.

The first data pattern 510 may overlap the gate electrode 240 of the first transistor T1. The first data pattern 510 may be electrically connected to the gate electrode 240 of the first transistor T1 through the first contact hole VIAL penetrating the third insulating layer 833 and the second insulating layer 832 to expose the gate electrode 240 of the first transistor T1 in the overlapping region. The first contact hole VIA1 may be located in the opening 341 of the storage capacitor electrode 340. The first data pattern 510 in the second contact hole VIA2 and the adjacent storage capacitor electrode 340 may be insulated from each other through the third insulating layer 833.

The first data pattern 510 may extend upward from the overlapping region with the gate electrode 240 of the first transistor T1, e.g., towards the up side of the pixel PXi, to be isolated from the first lower scan signal line 210 and the first upper scan signal line 310, may overlap the first lower scan signal line 210 and the first upper scan signal line 310 along the third direction, and may further extend upward to overlap the second scan signal line 320 along the third direction while being isolated from the second scan signal line 320. The first data pattern 510 may overlap, along the third direction, the right side of the first upper semiconductor pattern 410 to form the second electrode of the third transistor. The first data pattern 510 may overlap, along the third direction, the lower side of the second upper semiconductor pattern 420 to form the first electrode of the fourth transistor T4.

The second data pattern 520 may overlap the upper portion 111 of the first vertical portion 110 of the lower semiconductor layer 100. The second data pattern 520 may be brought into contact with the upper portion 111 of the first vertical portion 110 of the lower semiconductor layer 100 through the second contact hole VIA2 penetrating the third insulating layer 833, the second insulating layer 832, and the first insulating layer 831 to expose the upper portion 111 of the first vertical portion 110 of the lower semiconductor layer 100 in the overlapping region. The second data pattern 520 may also extend upward from the overlapping region with the first vertical portion 110 of the lower semiconductor layer 100 to overlap the left side of the first upper semiconductor pattern 410 to form the first electrode of the third transistor T3.

The third data pattern 530 may overlap the initialization voltage line 330. The third data pattern 530 may be brought into contact with the initialization voltage line 330 through the third contact hole VIA3 penetrating the third insulating layer 833 and the second insulating layer 832 to expose the initialization voltage line 330. The third data pattern 530 may also extend downward from the initialization voltage line 330 to overlap the right side of the second upper semiconductor pattern 420 to form the second electrode of the fourth transistor T4.

The third conductive layers 510, 520, and 530 may have a single-layer structure including at least one selected from molybdenum (Mo), aluminum (Al), platinum (Pt), palladium (Pd), silver (Ag), magnesium (Mg), gold (Au), nickel (Ni), neodymium (Nd), iridium (Ir) (Cr), calcium (Ca), titanium (Ti), tantalum (Ta), tungsten (W), and copper (Cu), or the like, or may have a multilayer structure of Ti/Al/Ti, Mo/Al/Mo, Mo/AlGe/Mo, or Ti/Cu. In an embodiment, the third conductive layers 510, 520, and 530, similarly to the first conductive layers 210, 220, and 240, may include a gate conductive material such as molybdenum (Mo).

As illustrated in FIG. 5, the fourth insulating layer 834 serves to insulate the third conductive layers 510, 520, and 530 and the fourth conductive layers 610, 620, 630, and 640. The fourth insulating layer 834 may be on the third conductive layers 510, 520, and 530, and may be over the entire surface of the substrate 810. The fourth insulating layer 834 may be an interlayer insulating film. The fourth insulating layer 834 may include the same material as the above-described second insulating layer 832 or may include at least one material selected from the materials exemplified as the constituent materials of the second insulating layer 832. The fourth insulating layer 834 may be a single film or a multilayer film formed of a laminate film of different materials.

Figure 4G:
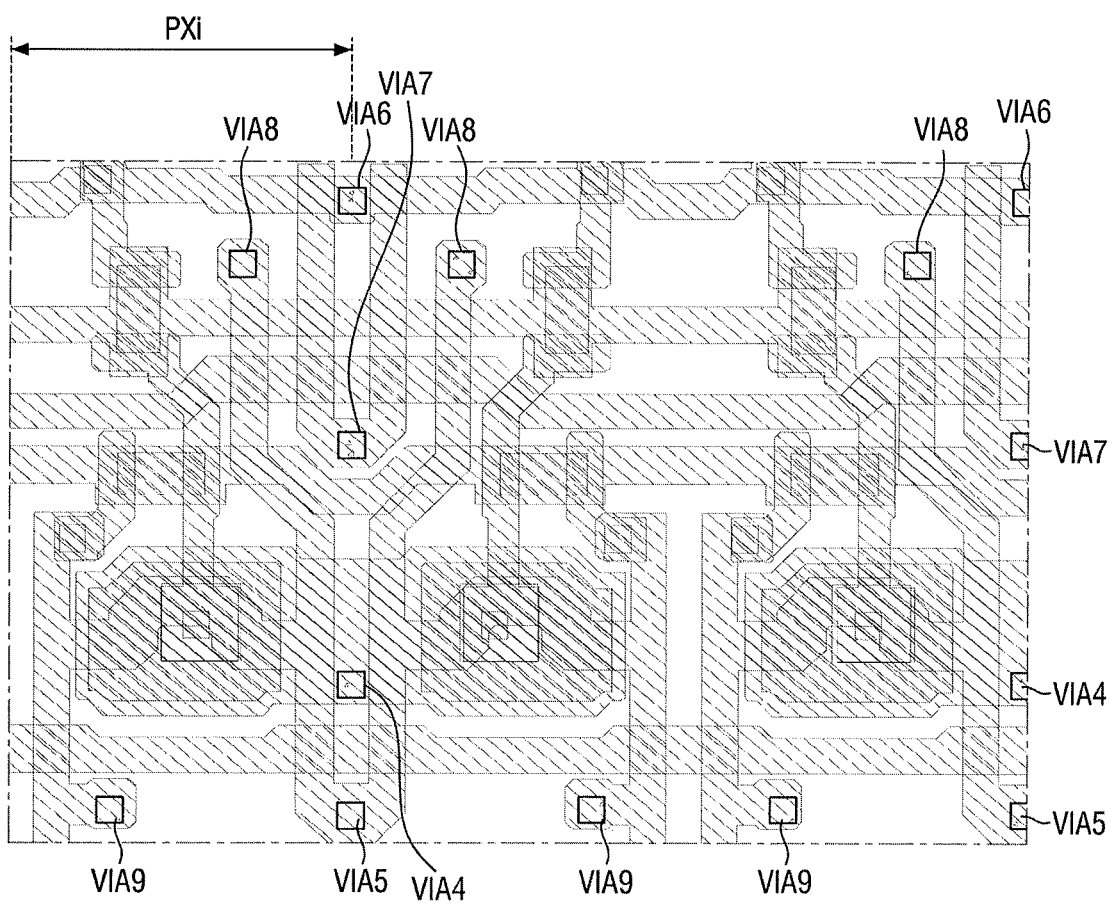
Figure 4G:
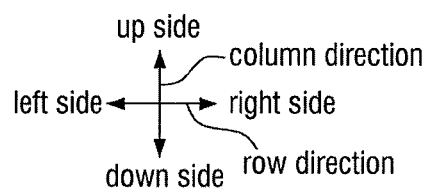

As illustrated in FIG. 4G, a plurality of contact holes VIA4 to VIA8 may be formed in the fourth insulating layer 834. The contact holes VIA4 to VIA8 may respectively expose a part of the storage capacitor electrode 340, a part of the lower portion 122 of the second vertical portion 120, part of the lower portion 112 of the first vertical portion 110 of the lower semiconductor layer 100, and a part of the upper portion 121 of the second vertical portion 120.

Figure 4H:
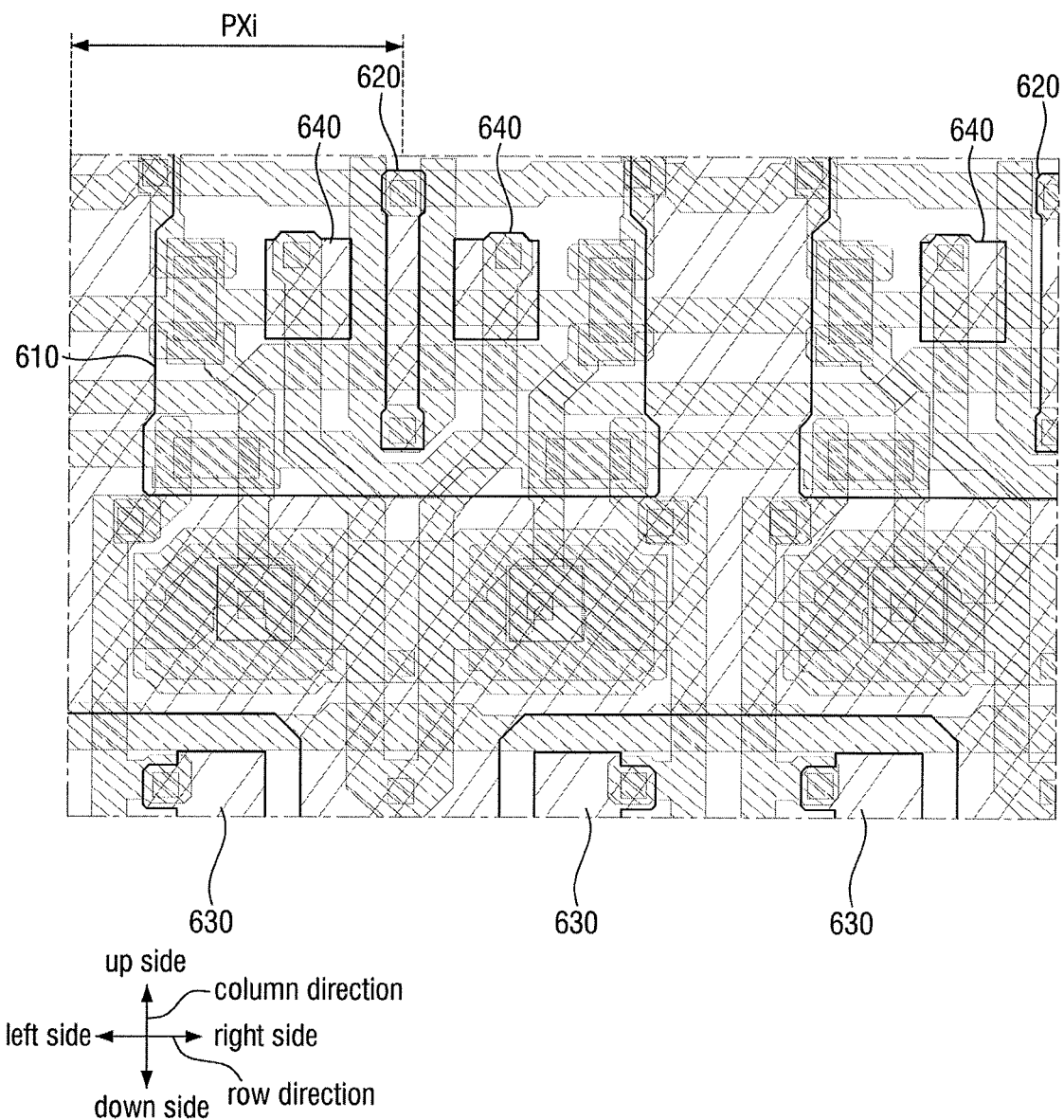

As illustrated in FIG. 4H, the fourth conductive layers 610, 620, 630, and 640 are on the fourth insulating layer 834. The fourth conductive layers 610, 620, 630, and 640 may include a first power supply voltage line 610 supplying a first power supply voltage ('ELVDD' in FIG. 3, the same below), an initialization bridge electrode 620 allowing the initialization voltage line 330 to supply a power to the seventh transistor T7, a first light emission bridge electrode 630 allowing the light emission control line 220 to supply a light emission control signal ('EM' in FIG. 3) to the sixth transistor T6, and a data bridge electrode 640 allowing a second data line 720 to be described later to supply a data signal ('DATA' in FIG. 3) to the second transistor T2.

The first power supply voltage line 610 may extend along the row direction, and may include a horizontal stem covering the gate electrode 240 of the first transistor T1 and a vertical stem extending from the horizontal stem. The first power supply voltage line 610 may be formed such that the width of the first power supply voltage line 610 is increased by a lower wiring structure. The first power supply voltage line 610 may be formed to cover not only the gate electrode but also the storage capacitor electrode 340 and a part of the lower wiring. The first power supply voltage line 610 may extend to the neighboring pixel beyond the boundary of the pixel PXi along the row direction and/or the column direction.

The first power source voltage line 610 may be electrically connected to the storage capacitor electrode 340 through the fourth contact hole VIA4 penetrating the third insulating layer 833 and the fourth insulating layer 834. The first power source voltage line 610 may be electrically connected to the lower portion 122 of the second vertical portion 120 of the lower semiconductor layer 100 through the fifth contact hole VIA5 penetrating the second insulating layer 832, the third insulating layer 833, and the fourth insulating layer 834.

The width of the first power supply voltage line 610 may be increased to block upper and lower external light. Accordingly, it is possible to increase the long range uniformity (hereinafter, 'LRU') of luminance of the organic light emitting display device 60. Further, the first power supply voltage line 610 having a certain level of wiring width can maintain a voltage signal constant, so that the coupling between upper and lower wirings can be prevented.

The initialization bridge electrode 620 may overlap the initialization voltage line 330. The initialization bridge electrode 620 may be brought into contact with the initialization voltage line 330 through the sixth contact hole VIA6 penetrating the fourth insulating layer 834, the third insulating layer 833, and the second insulating layer 832 to expose the initialization voltage line 330 in the overlapping region.

The initialization bridge electrode 620 may also extend downward from the overlapping region towards the down side of the pixel PXi with the initialization power supply line 330 to overlap the lower side of the third vertical portion 130 of the lower semiconductor layer 100. The initialization bridge electrode 620 may be brought into contact with the third vertical portion 130 of the lower semiconductor layer 100 through the seventh contact hole VIA7 penetrating the fourth insulating layer 834, the third insulating layer 833, the second insulating layer 832, and the first insulating layer 831 to expose the third vertical portion 130 of the lower semiconductor layer 100 in the overlapping region.

The first light emission bridge electrode 630 may overlap the lower portion 112 of the first vertical portion 110 of the lower semiconductor layer 100. The first light emission bridge electrode 630 may be brought into contact with the lower portion 112 of the first vertical portion 110 of the lower semiconductor layer 100 through the ninth contact hole VIA9 penetrating the fourth insulating layer 834, the third insulating layer 833, the second insulating layer 832, and the first insulating layer 831 to expose the lower portion 112 of the first vertical portion 110 of the lower semiconductor layer 100 in the overlapping region.

The data bridge electrode 640 may overlap the upper portion 121 of the second vertical portion 120 of the lower semiconductor layer 100. The data bridge electrode 640 may be brought into contact with the second vertical portion 120 of the lower semiconductor layer 100 through the eighth contact hole VIA8 penetrating the fourth insulating layer 834, the third insulating layer 833, the second insulating layer 832, and the first insulating layer 831 to expose the upper portion 121 of the second vertical portion 120 of the lower semiconductor layer 100 in the overlapping region.

Here, the data bridge electrode 640 may be a source/drain electrode contacting the source/drain region of the lower semiconductor layer 100.

The fourth conductive layers 610, 620, 630, and 640 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir) (Cr), calcium (Ca), titanium (Ti), tantalum (Ta), tungsten (W), copper (Cu), or the like. The fourth conductive layers 610, 620, 630, and 640 may be a single film or a multilayer film. For example, the fourth conductive layers 610, 620, 630, and 640 may have a multilayer structure of Ti/Al/Ti, Mo/Al/Mo, Mo/AlGe/Mo, or Ti/Cu. In an embodiment, the fourth conductive layers 610, 620, 630, and 640 may include a source/drain conductive material such as Ti/Al/Ti.

As illustrated in FIG. 5, the fifth insulating layer 841 covers the fourth conductive layers 610, 620, 630, and 640. The fifth insulating layer 841 serves to insulate the fourth conductive layers 610, 620, 630, and 640, and fifth conductive layers 710, 720, and 730 to be described later. The fifth insulating layer 841 may be on the fourth conductive layers 610, 620, 630, and 640, and may be over the entire surface of the substrate 810. The fifth insulating layer 841 may be a via layer.

The fifth insulating layer 841 may be made of an inorganic material, an organic material, or an organic/inorganic composite material to have a single layer structure or a multi-layer structure, and may be formed of various deposition methods. In some embodiments, the via layer may be formed of at least one selected from polyacrylate resin, epoxy resin, phenolic resin, polyamide resin, polyimide resin, unsaturated polyester resin, polyphenylene ether resin, polyphenylene sulfide resin, and benzocyclobutene (BCB).

Figure 4I:
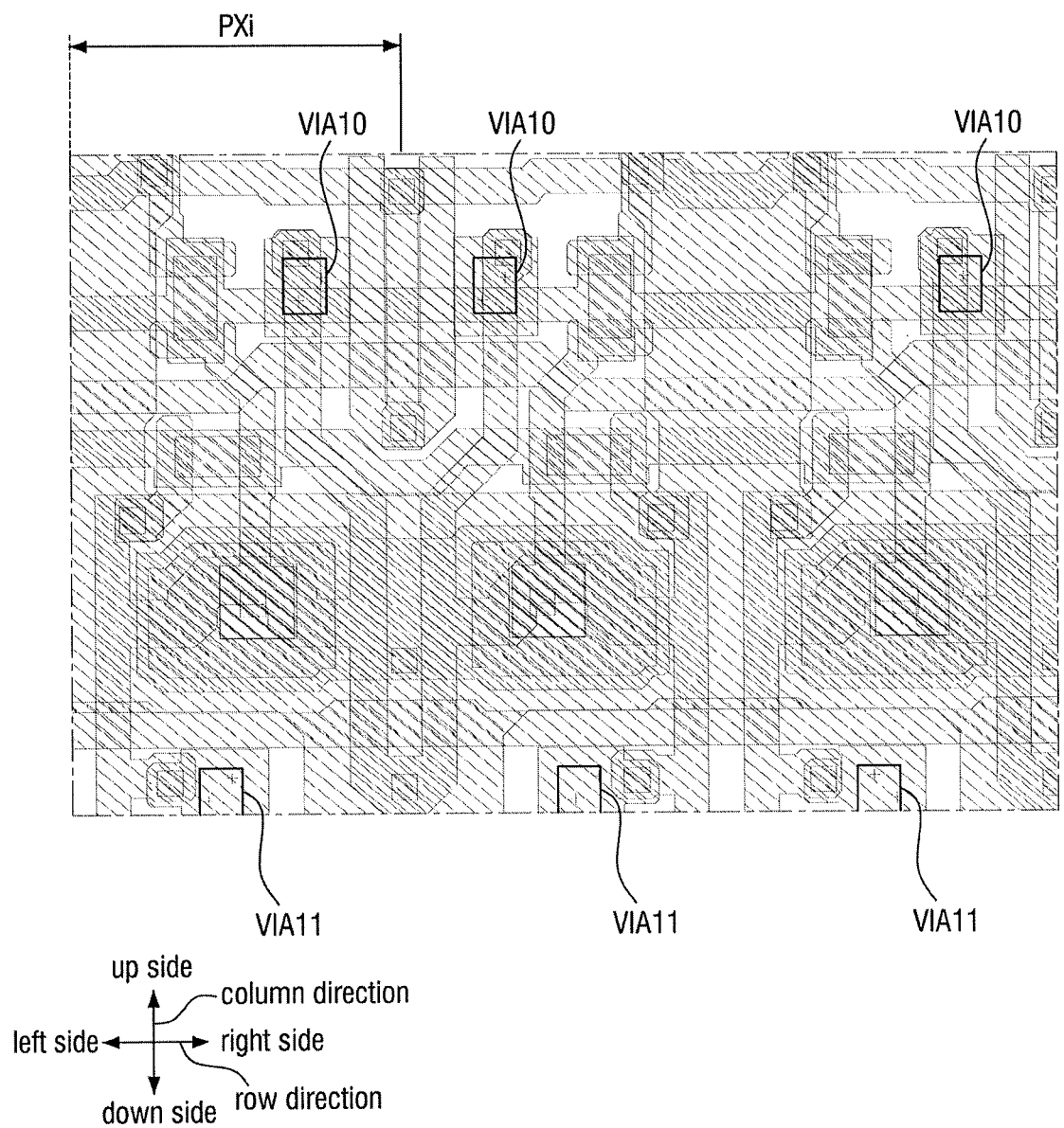

As illustrated in FIG. 4I, contact holes VIA10 and VIA11 for respectively exposing the data bridge electrode 640 and the first light emission bridge electrode 630 may be formed in the fifth insulating layer 841.

Figure 4J:
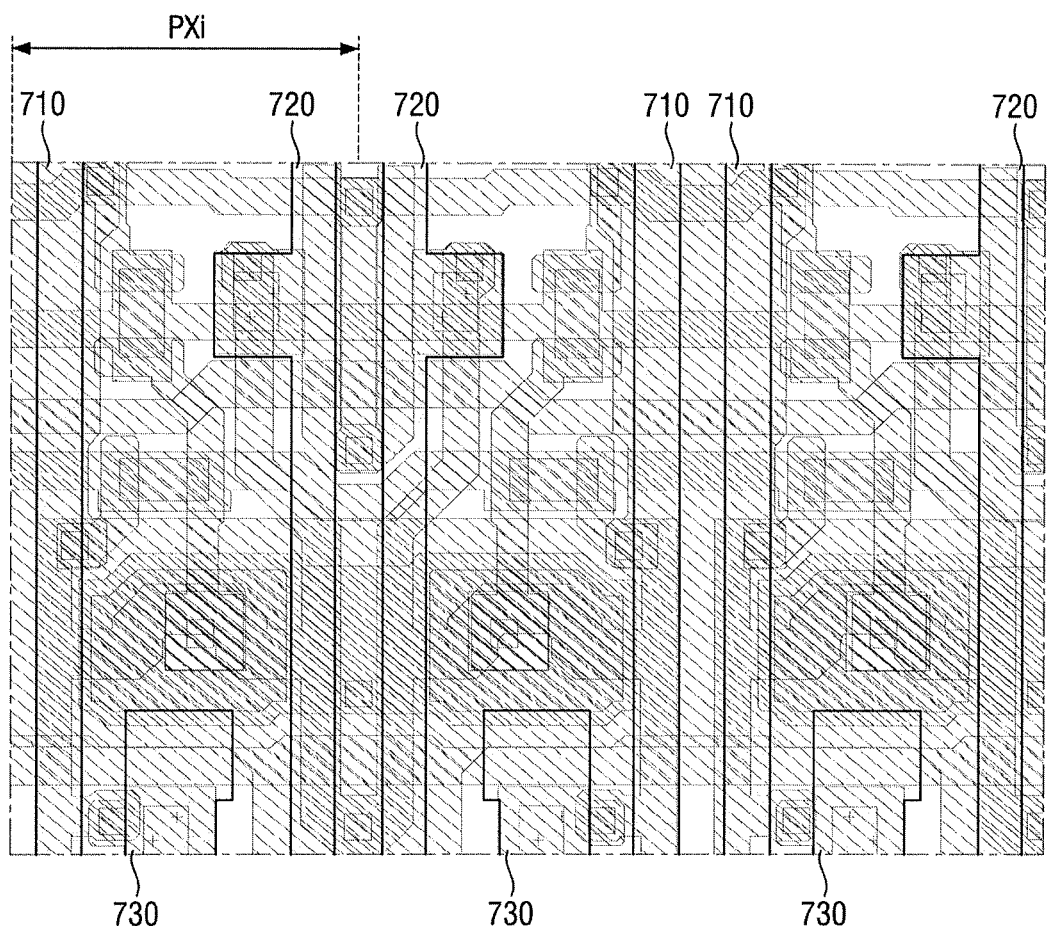
Figure 4J:
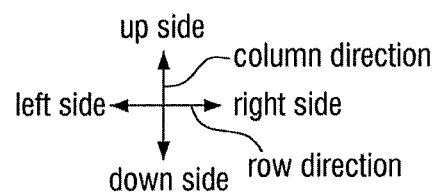

As illustrated FIG. 4J, the fifth conductive layers 710, 720, and 730 are on the fifth insulating layer 841. The fifth conductive layers 710, 720, and 730 may include a first data line 710 supplying a data signal to one pixel PXi, a second data line 720 supplying a signal to another pixel PXi adjacent to the one pixel PXi in the column direction, and a second light emission bridge electrode 730 allowing the light emission control line 220 to supply a driving current Id to an anode electrode to be described later. Here, the first data lines 710 may be odd data lines ('DL11 to DLm1' in FIG. 2), and the second data lines 720 may be even data lines ('DL12 to DLm2' in FIG. 2).

The first data line 710 and the second data line 720 extend along the column direction at both left and right edges of the pixel PXi. The first data line 710 and the second data line 720 may overlap the data bridge electrode 640. The line widths of the first data line 710 and the second data line 720 may increase before and after the data bridge electrode 640 so as to overlap the data bridge electrode 640. The first data line 710 and the second data line 720 may be brought into contact with the data bridge electrode 640 through the tenth contact hole VIA10 penetrating the fifth insulating layer 841 to exposes the data bridge electrode 640.

The second light emission bridge electrode 730 may overlap the first light emission bridge electrode 630. The second light emission bridge electrode 730 may be brought into contact with the first light emission bridge electrode 630 through the eleventh contact hole VIA11 penetrating the fifth insulating layer 841 to exposes the first light emission bridge electrode 630.

The fifth conductive layers 710, 720, and 730 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir) (Cr), calcium (Ca), titanium (Ti), tantalum (Ta), tungsten (W), and copper (Cu). The fifth conductive layers 710, 720, and 730 may be a single film or a multilayer film. For example, the fifth conductive layers 710, 720, and 730 may have a multilayer structure of Ti/Al/Ti, Mo/Al/Mo, Mo/AlGe/Mo, or Ti/Cu. In an embodiment, the fifth conductive layers 710, 720, and 730, similarly to the fourth conductive layers 610, 620, 630, and 640, may include a source/drain conductive material such as Ti/Al/Ti.

As illustrated in FIG. 5, the sixth insulating layer 842 covers the fifth conductive layers 710, 720, and 730. The sixth insulating layer 842 serves to insulate the fifth conductive layers 710, 720, and 730, and an anode electrode AND to be described later. The sixth insulating layer 842 may be on the fifth conductive layers 710, 720, and 730, and may be over the entire surface of the substrate 810. The sixth insulating layer 842 may be a via layer. The sixth insulating layer 842 may be formed of the same material as the fifth insulating layer 841 or may be formed of at least one of the materials listed in the description of the fifth insulating layer 841.

Figure 4K:
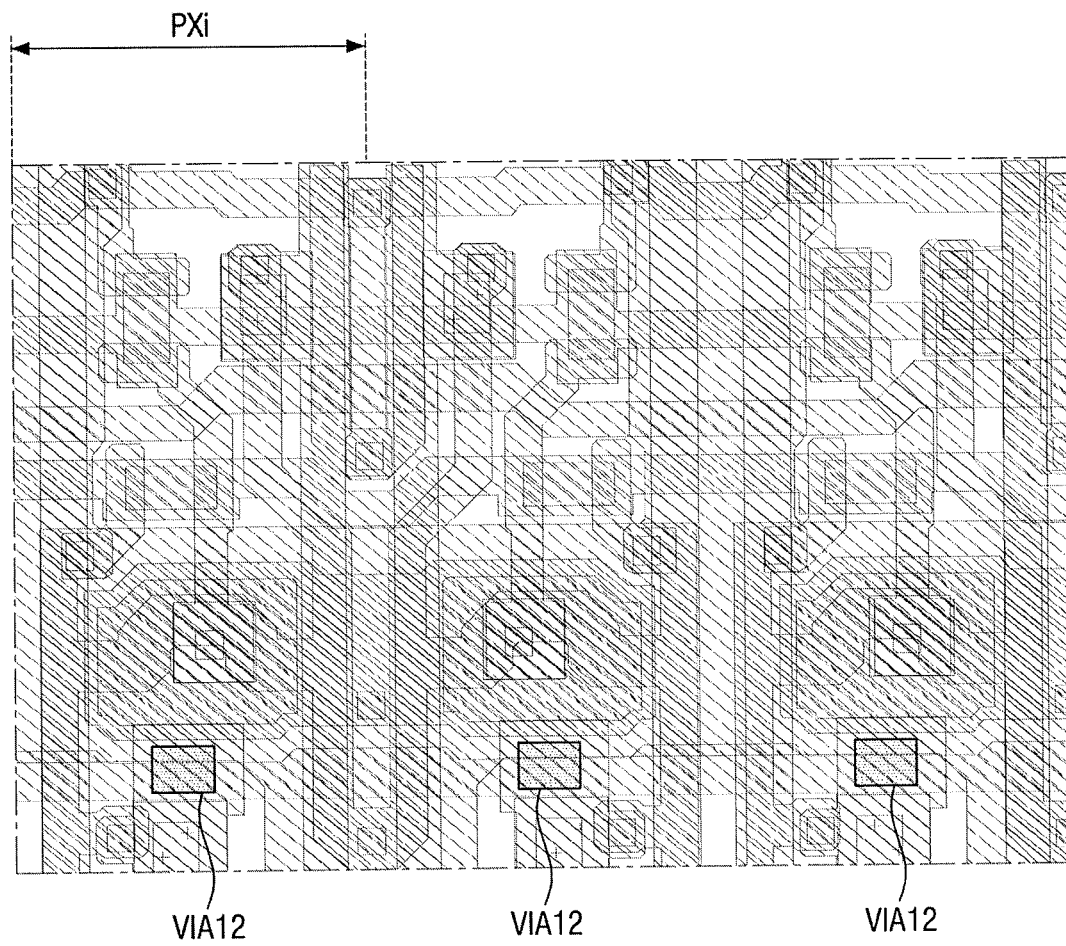
Figure 4K:
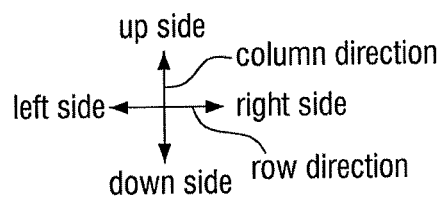

As illustrated in FIG. 4K, a twelfth contact hole VIA12 exposing the second light emission bridge electrode 730 may be formed in the sixth insulating layer 842.

Figure 4L:
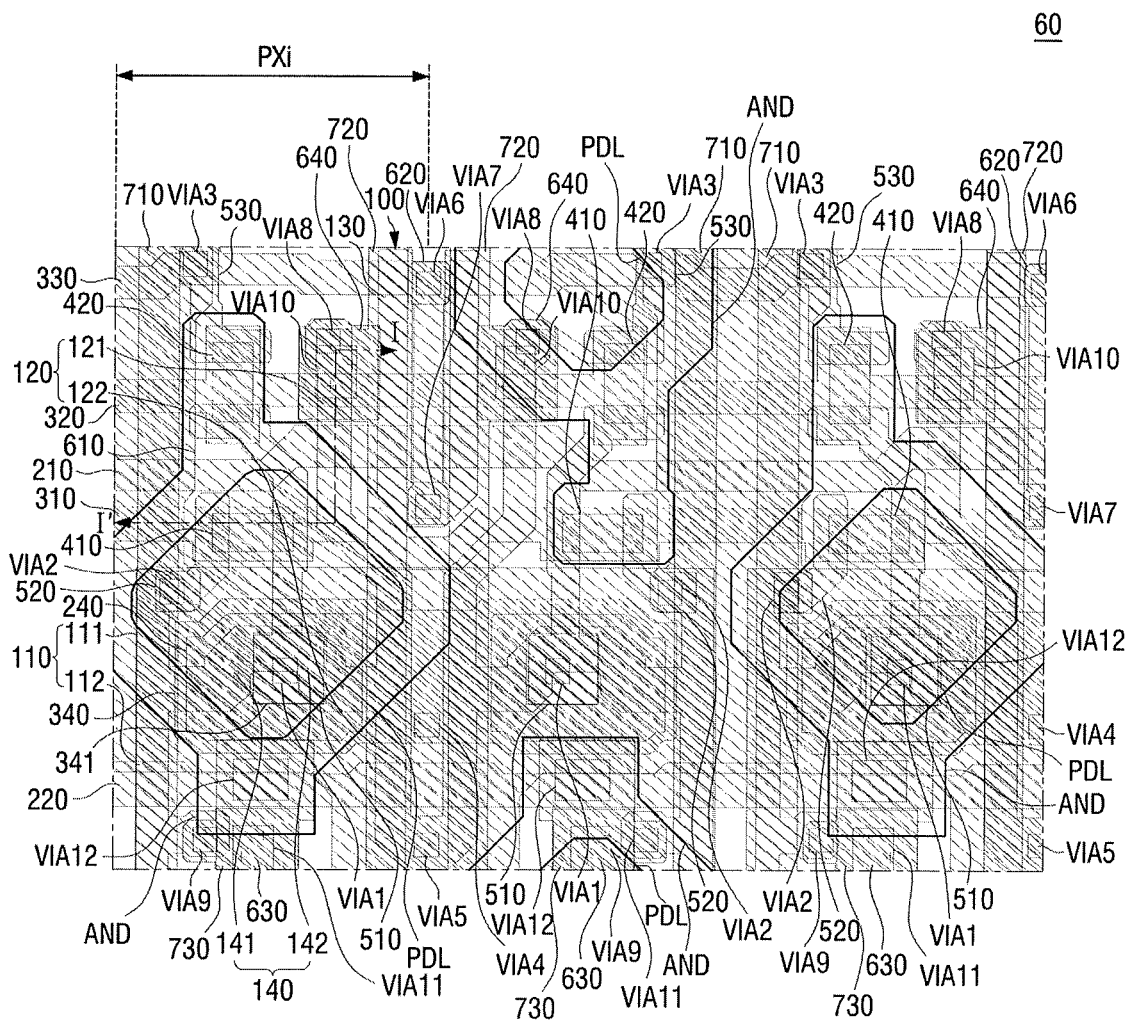

As illustrated in FIG. 5 and FIG. 4L, the anode electrode AND and the pixel defining layer PDL are on the sixth insulating layer 842. The anode electrode AND is brought into contact with the second light emission bridge electrode 730 through the twelfth contact hole VIA12. The anode electrode AND may receive a driving current Id from the light emission control line 220 through the first light emission bridge electrode 630 and the second light emission bridge electrode 730.

The anode electrode AND may be formed to overlap the gate electrode 240 of the first transistor T1 so as to cover the gate electrode 240 of the first transistor T1, and may be extended upward to cover the gate electrode 410 of the third transistor T3 and the gate electrode 420 of the fourth transistor T4. The anode electrode AND formed to cover the gate electrode 410 of the third transistor T3 and the gate electrode 420 of the fourth transistor T4 may have a function of blocking the inflowing of external light into the third transistor T3 and the fourth transistor T4.

As described above, the anode electrode AND is formed to overlap the third transistor T3 and the fourth transistor T4, and the width of the first power supply voltage line 610 is enlarged, so as to increase LRU. In an embodiment, the LRU may be 90% or more.

The anode electrode AND may include a material having a high work function. The anode electrode AND may include indium-tin oxide (ITO), indium-zinc oxide (IZO), zinc oxide (ZnO), or indium oxide ($In_2O_3$). The above-exemplified conductive materials have a relatively high work function and transparent characteristics. When the organic light emitting display device 60 is a front emission type display device, the anode electrode AND may further include a reflective material such as silver (Ag), magnesium (Mg), aluminum (Al), platinum (Pt), palladium (Pd), gold (Au), nickel (Ni), neodymium (Nd), iridium (Ir), lithium (Li), calcium (Ca), or a mixture thereof, in addition to the above-exemplified conductive material. Therefore, the anode electrode AND may have a single-layer structure made of the above-described conductive material and reflective material, or may have a multi-layer structure in which these layers are laminated.

The pixel defining layer PDL is on the anode electrode AND. The pixel defining layer PDL includes an opening exposing at least a part of the anode electrode AND. The pixel defining layer PDL may include an organic material or an inorganic material. In an embodiment, the pixel defining layer PDL may include a material such as a photoresist, a polyimide resin, an acrylic resin, a silicon compound, or a polyacrylic resin.

An organic light emitting layer may be on the anode electrode AND exposed by the pixel defining layer PDL, and a cathode electrode may be on the organic light emitting layer. The cathode electrode may be a common electrode disposed without distinguishing pixels.

The cathode electrode may include a material having a low work function. The cathode electrode may include Li, Ca, LiF/Ca, LiF/Al, Al, Mg, Ag, Pt, Pd, Ni, Au Nd, Ir, Cr, BaF, Ba, or a compound or mixture thereof (for example, a mixture of Ag and Mg). The cathode electrode may further include an auxiliary electrode. The auxiliary electrode may be a film formed by depositing the above material, and the film may include transparent metal oxide such as indium-tin oxide (ITO), indium-zinc oxide (IZO), zinc oxide (ZnO), or indium-tin-Zinc oxide (ITZO).

When the organic light emitting display device 60 is a front emission type display device, a conductive thin film having a low work function may be formed as the cathode electrode, and may be laminated thereon with a conductive layer such as an indium-tin oxide (ITO) layer, an indium-zinc oxide (IZO) layer, a zinc oxide (ZnO) layer, or an indium oxide ($In_2O_3$) layer.

The aforementioned anode electrode AND, organic light emitting layer, and cathode electrode may constitute an organic light emitting diode OLED.

The organic light emitting display device 60 may be applied to a high-resolution product having a resolution of, for example, 552 ppi or more. Further, the organic light emitting display device 60 is capable of low frequency driving and high frequency driving. The low-frequency driving may be a frequency driving of 1 Hz, and the high-frequency driving may be a frequency driving of 90 Hz to 250 Hz. In an embodiment, the organic light emitting display device 60 can be driven at a frequency of 1 Hz and/or 120 Hz.

The organic light emitting display 60 according to the present embodiment is able to secure compensation time even in high frequency driving by receiving different data signals between adjacent pixels in the column direction. Further, since the organic light emitting display device 60 according to the present embodiment can reduce the leakage of current by using an oxide semiconductor for the third transistor and the fourth transistor, it is possible to prevent a user from visually recognizing flickers and prevent spots from appearing even in low-frequency driving.

Next, an organic light emitting display device according to another embodiment will be described. In the following embodiments, descriptions overlapping those described with respect to FIGS. 1 to 5 will be omitted. Further, the same reference numerals are used for the same components as those described in FIGS. 1 to 5.

Figure 6:
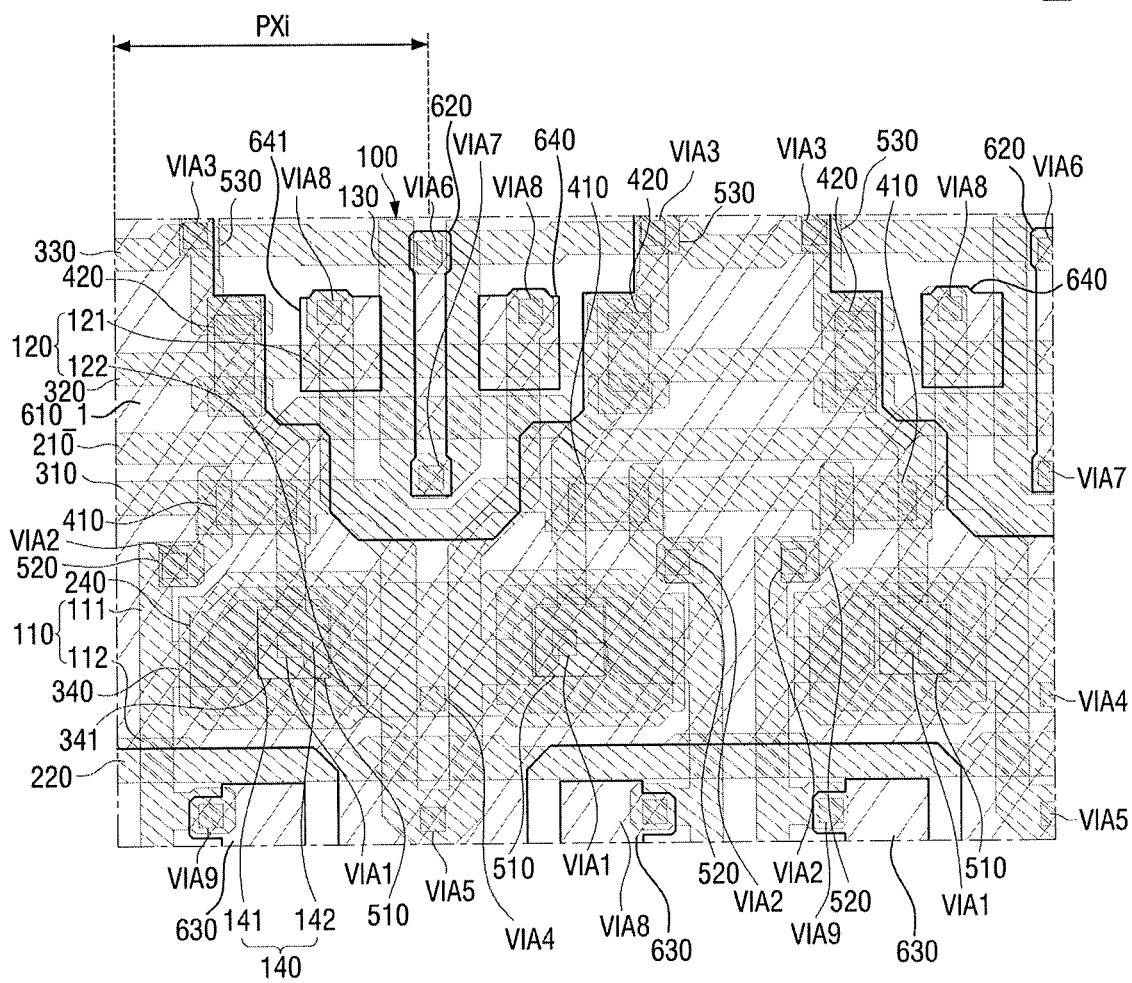
FIG. 6 illustrates a layout view of an organic light emitting display device according to another embodiment.
Figure 6:
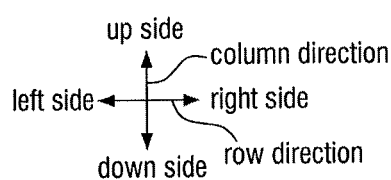

FIG. 6 is a layout view of an organic light emitting display device according to another embodiment. Referring to FIG. 6, an organic light emitting display device 61 according to the present embodiment is different from the embodiment of FIG. 4L in that among fourth conductive layers 610_1, 620, 630, and 640, the first power supply voltage line 610_1 includes a region extending to overlap the third transistor T3 and the fourth transistor T4, and thus the width thereof is larger than that of the embodiment of FIG. 4.

Specifically, the first power supply voltage line 610_1 may extend along the row direction, and may include a horizontal stem covering the gate electrode 240 of the first transistor T1 and a vertical stem extending from the horizontal stem. The first power supply voltage line 610__1 may extend to the neighboring pixel beyond the boundary of the pixel PXi along the row direction. The first power supply voltage line 610_1 may include a region overlapping the third transistor T3 and the fourth transistor T4 to cover the third transistor T3 and the fourth transistor T4. The first power supply voltage line 610_1 may block the inflow of external light into the third transistor T3 and the fourth transistor T4 by the extended region thereof to prevent the malfunction of corresponding transistors T3 and T4.

In the organic light emitting display device 61, the fifth insulating layer 841, fifth conductive layers 710, 720, and 730, the sixth insulating layer 842, the anode electrode AND, and the pixel defining layer PDL may be sequentially provided on the fourth conductive layers 610_1, 620, 630, and 640.

The organic light emitting display 61 according to the present embodiment has a resolution similar to that of the embodiment of FIG. 4 and can be driven at a frequency similar to that of the embodiment of FIG. 4. Specifically, the organic light emitting display 61 according to the present embodiment can be applied to high-resolution products and can prevent the recognition of flickers and the aggravation of spots even in high-frequency driving and low-frequency driving.

Figure 7:
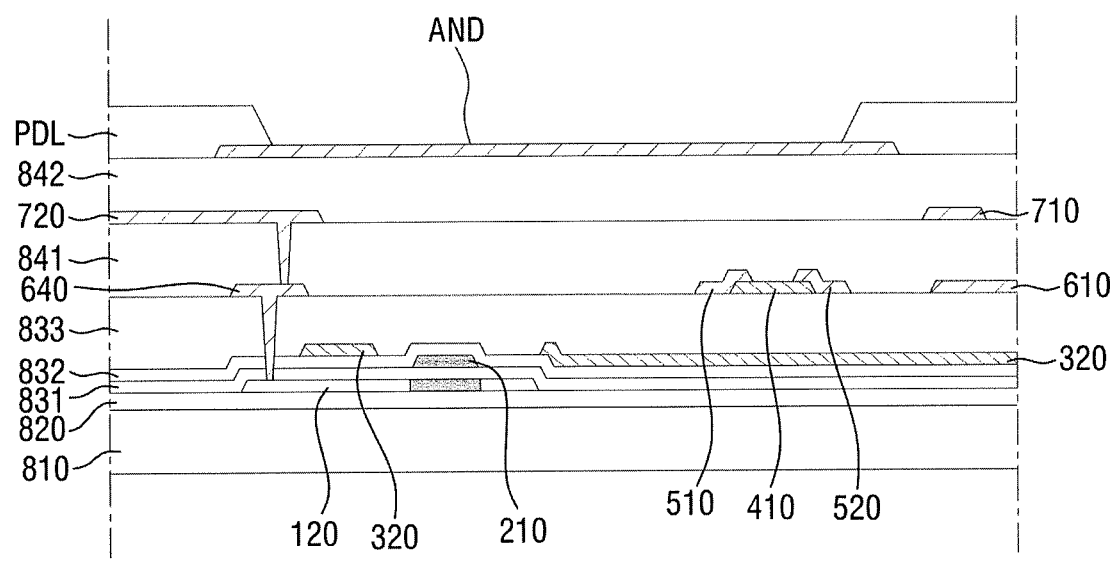
FIG. 7 illustrates a cross-sectional view of an organic light emitting display device according to still another embodiment.

FIG. 7 is a cross-sectional view of an organic light emitting display device according to still another embodiment. An organic light emitting display device 62 according to the present embodiment is different from the embodiment of FIG. 5 in that the fourth insulating layer ('834' in FIG. 5) is omitted.

Referring to FIG. 7, the first data pattern 510 and the second data pattern 520 are on the same layer as the first power supply voltage line 610 and the data bridge electrode 640. All the wirings corresponding to the third conductive layers 510, 520, and 530 and the fourth conductive layers 610, 620, 630, and 640 may be on the same layer.

The first data pattern 510 and the second data pattern 520 may include the same material as the first power supply voltage line 610 and the data bridge electrode 640. In an embodiment, the same material may be a gate conductive material such as molybdenum (Mo) or one of source/drain materials such as Ti/Al/Ti. Alternatively, the first data pattern 510 and the second data pattern 520 may include a gate conductive material, and the first power supply voltage line 610 and the data bridge electrode 640 may include source/drain conductive materials, respectively.

The data patterns 510, 520, and 530 may be in direct contact with the upper semiconductor layers 410 and 420 formed on the third insulating layer 833, and the first power supply voltage line 610, the initialization bridge electrode 620, the first light emission bridge electrode 630 and the data bridge electrode 640 may be on the third insulating layer which is the same layer as the data patterns 510, 520, and 530.

The organic light emitting display 62 according to the present embodiment has a resolution similar to that of the embodiment of FIG. 5, can be driven at a frequency similar to that of the embodiment of FIG. 5, and one mask can be reduced in the laminate structure.

As described above, according to the embodiments, recognition of flicker by a user may be reduced even in low-frequency driving and high-frequency driving, allowing reduction in distracting and annoying screen spots.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
    a pixel row including a plurality of pixels arranged in a first direction;
    a first data line extending along the first direction at a first edge of the pixel row;
    a second data line extending along the first direction at a second edge of the pixel row, opposite the first edge of the pixel row along a second direction that is perpendicular to the first direction;
    a first pixel connected to the first data line; and
    a second pixel adjacent to the first pixel in the first direction and connected to the second data line,
    wherein each of the first pixel and the second pixel includes a light emitting diode, a first transistor to transmit a driving current to the light emitting diode, a second transistor to transmit a data signal to the first transistor, a third transistor to transmit the data signal having a compensated threshold voltage to a gate electrode of the first transistor, and a fourth transistor to transmit an initialization voltage signal to the gate electrode of the first transistor,
    the first transistor and the second transistor of each of the first pixel and the second pixel are PMOS transistors, and
    the third transistor and the fourth transistor of each of the first pixel and the second pixel are NMOS transistors.

2. The display device as claimed in claim 1, wherein:
    the first data line is not connected to the second pixel, and
    the second data line is not connected to the first pixel.

3. The display device as claimed in claim 2, wherein time taken the data signal to be provided from the first data line to the first pixel is different from time taken the data signal to be provided from the second data line to the second pixel.

4. The display device as claimed in claim 1, wherein:
    a semiconductor layer of the PMOS transistors includes polycrystalline silicon, and
    a semiconductor layer of the NMOS transistors includes an oxide semiconductor.

5. The display device as claimed in claim 4, wherein a source or drain electrode of the NMOS transistors is directly on the semiconductor layer of the NMOS transistors.

6. The display device as claimed in claim 1, wherein an anode electrode of the light emitting diode covers a semiconductor layer of the third transistor and a semiconductor layer of the fourth transistor.

7. The display device as claimed in claim 1, further comprising:
    a first scan line connected to a gate electrode of the second transistor and a gate electrode of the third transistor; and
    a second scan line connected to a gate electrode of the fourth transistor.

8. The display device as claimed in claim 7, wherein the first scan line and the second scan line extend in the second direction.

9. The display device as claimed in claim 1, wherein each of the first pixel and the second pixel further includes a power supply voltage line to provide a power supply voltage to each of the first pixel and the second pixel.

10. The display device as claimed in claim 9, wherein the power supply voltage line is formed to cover a semiconductor layer of the third transistor and a semiconductor layer of the fourth transistor.

11. A display device, comprising:
    a substrate on which a plurality of pixel regions is defined;
    a lower semiconductor layer on the substrate;
    a first conductive layer on the lower semiconductor layer;
    a second conductive layer on the first conductive layer;
    an upper semiconductor layer on the second conductive layer;
    a third conductive layer on the upper semiconductor layer; and
    a fourth conductive layer on the third conductive layer, wherein
    the lower semiconductor layer is a semiconductor layer of a PMOS transistor,
    the upper semiconductor layer is a semiconductor layer of an NMOS transistor, and
    the lower semiconductor layer, the first conductive layer, the second conductive layer, the upper semiconductor layer, the third conductive layer, and the fourth conductive layer are in the respective pixel regions.

12. The display device as claimed in claim 11, wherein:
    the lower semiconductor layer includes an oxide semiconductor, and
    the upper semiconductor layer includes polycrystalline silicon.

13. The display device as claimed in claim 12, wherein the lower semiconductor layer does not overlap the upper semiconductor layer in a thickness direction.

14. The display device as claimed in claim 11, wherein:
    the first conductive layer and the second conductive layer include molybdenum, and
    the third conductive layer and the fourth conductive layer include aluminum.

15. The display device as claimed in claim 11, wherein, in each of the pixel regions, the fourth conductive layer includes a first data line and a second data line.

16. The display device as claimed in claim 15, wherein the first data line and the second data line are spaced apart from each other.

17. The display device as claimed in claim 15, further comprising a pixel electrode electrically connected to any one of the first data line and the second data line.

18. The display device as claimed in claim 17, wherein the pixel electrode is not electrically connected to one of the first data line and the second data line.

19. The display device as claimed in claim 11, wherein the third conductive layer is directly on the upper semiconductor layer.

20. The display device as claimed in claim 11, wherein the third conductive layer includes:
    a source or drain electrode electrically connected to the upper semiconductor layer; and
    a source or drain electrode electrically connected to the lower semiconductor layer.

* * * * *